United States Patent
Sasaki et al.

(10) Patent No.: US 8,748,876 B2
(45) Date of Patent: Jun. 10, 2014

(54) LIGHT-EMITTING ELEMENT, LIGHT-EMITTING MODULE, LIGHT-EMITTING PANEL, AND LIGHT-EMITTING DEVICE

(75) Inventors: Toshiki Sasaki, Kanagawa (JP);
Nozomu Sugisawa, Kanagawa (JP);
Shunpei Yamazaki, Tokyo (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 13/467,534

(22) Filed: May 9, 2012

(65) Prior Publication Data
US 2012/0286305 A1    Nov. 15, 2012

(30) Foreign Application Priority Data

May 11, 2011    (JP) ................. 2011-106409

(51) Int. Cl.
*H01L 29/08*    (2006.01)
(52) U.S. Cl.
USPC .............. 257/40; 257/E33.001; 257/E27.111; 257/E33.072; 438/458
(58) Field of Classification Search
USPC ............... 257/40, E33.001, E27.111, 79, 98, 257/E21.211, E33.072, 43, 59, 72, 88, 257/E21.6; 438/458, 455, 22, 29, 30
See application file for complete search history.

(56) References Cited

U.S. PATENT DOCUMENTS

| | | |
|---|---|---|
| 5,554,911 A | 9/1996 | Nakayama et al. |
| 6,831,408 B2 | 12/2004 | Hirano et al. |
| 6,847,163 B1 | 1/2005 | Tsutsui et al. |
| 7,030,553 B2 | 4/2006 | Winters et al. |
| 7,271,537 B2 | 9/2007 | Matsuda et al. |
| 7,291,969 B2 | 11/2007 | Tsutsui |
| 7,317,282 B2 | 1/2008 | Tsutsui et al. |
| 7,399,991 B2 | 7/2008 | Seo et al. |
| 7,462,883 B2 | 12/2008 | Kumaki et al. |
| 7,548,019 B2 | 6/2009 | Omura et al. |
| 7,554,265 B2 | 6/2009 | Godo et al. |
| 7,564,052 B2 | 7/2009 | Kumaki et al. |

(Continued)

FOREIGN PATENT DOCUMENTS

| | | |
|---|---|---|
| JP | 6-275381 | 9/1994 |
| JP | 2001-43980 | 2/2001 |

(Continued)

OTHER PUBLICATIONS

Matsumoto, T. et al, "27.5L: Late-News Paper: Multiphoton Organic EL Device Having Charge Generation Layer," SID Digest '03: SID International Symposium Digest of Technical Papers, vol. 34, 2003, pp. 979-981.

(Continued)

*Primary Examiner* — Zandra Smith
*Assistant Examiner* — Paul Patton
(74) *Attorney, Agent, or Firm* — Husch Blackwell LLP

(57) ABSTRACT

A light-emitting element, a light-emitting module, a light-emitting panel, or a light-emitting device in which loss due to electrical resistance is reduced is provided. The present invention focuses on a surface of an electrode containing a metal and on a layer containing a light-emitting organic compound. The layer containing a light-emitting organic compound is provided between one electrode including a first metal, whose surface is provided with a conductive inclusion, and the other electrode.

13 Claims, 8 Drawing Sheets

(56) References Cited

U.S. PATENT DOCUMENTS

| | | |
|---|---|---|
| 7,601,988 B2 | 10/2009 | Seo et al. |
| 7,663,149 B2 | 2/2010 | Seo et al. |
| 7,737,626 B2 | 6/2010 | Kumaki et al. |
| 7,753,751 B2 | 7/2010 | Yamazaki |
| 7,851,989 B2 | 12/2010 | Noda |
| 7,875,893 B2 * | 1/2011 | Seo et al. .................. 257/88 |
| 7,893,427 B2 | 2/2011 | Kumaki et al. |
| 7,956,349 B2 | 6/2011 | Tsutsui et al. |
| 7,964,891 B2 | 6/2011 | Kumaki et al. |
| 7,973,319 B2 | 7/2011 | Kashiwabara et al. |
| 8,008,652 B2 | 8/2011 | Kumaki et al. |
| 8,080,934 B2 | 12/2011 | Kido et al. |
| 8,461,578 B2 * | 6/2013 | Song et al. .................. 257/40 |
| 2006/0163597 A1 | 7/2006 | Noda et al. |
| 2006/0267483 A1 | 11/2006 | Tsutsui et al. |
| 2006/0284204 A1 | 12/2006 | Yamazaki et al. |
| 2007/0001570 A1 | 1/2007 | Nomura et al. |
| 2007/0176161 A1 | 8/2007 | Seo et al. |
| 2008/0241586 A1 | 10/2008 | Kumaki et al. |
| 2009/0275161 A1 | 11/2009 | Kumaki et al. |
| 2010/0123152 A1 | 5/2010 | Sugisawa et al. |
| 2010/0176720 A1 | 7/2010 | Yamazaki |
| 2010/0244725 A1 * | 9/2010 | Adamovich et al. .......... 315/291 |
| 2011/0101345 A1 | 5/2011 | Kumaki et al. |
| 2011/0101380 A1 | 5/2011 | Kumaki et al. |
| 2011/0108864 A1 | 5/2011 | Seo et al. |
| 2011/0140101 A1 | 6/2011 | Noda |
| 2011/0241007 A1 | 10/2011 | Kumaki et al. |
| 2011/0278562 A1 | 11/2011 | Kumaki et al. |
| 2011/0291088 A1 | 12/2011 | Seo et al. |
| 2011/0309351 A1 | 12/2011 | Kumaki et al. |
| 2012/0205701 A1 | 8/2012 | Sasaki et al. |
| 2012/0206675 A1 | 8/2012 | Seo et al. |

FOREIGN PATENT DOCUMENTS

| | | |
|---|---|---|
| JP | 2002-324673 | 11/2002 |
| JP | 2005-93401 | 4/2005 |
| JP | 2006-32327 | 2/2006 |
| JP | 2006-126817 | 5/2006 |
| JP | 2007-503093 | 2/2007 |
| JP | 2010-153365 | 7/2010 |

OTHER PUBLICATIONS

Kashiwabara, M. et al, "29.5L: Late-News Paper: Advanced AM-OLED Display Based on White Emitter with Microcavity Structure," SID Digest '04: SID International Symposium Digest of Technical Papers, vol. 35, 2004, pp. 1017-1019.

* cited by examiner

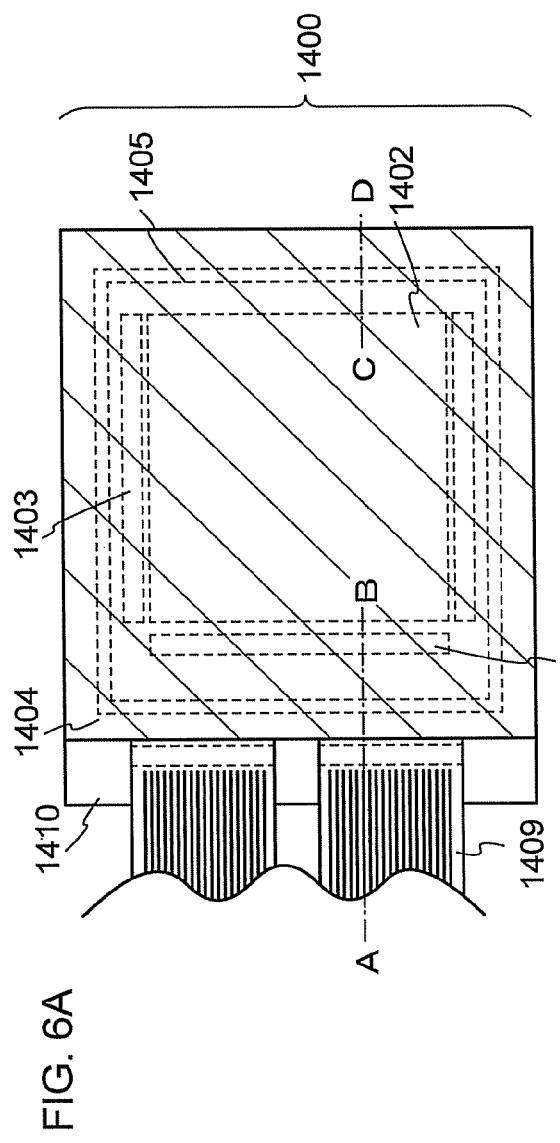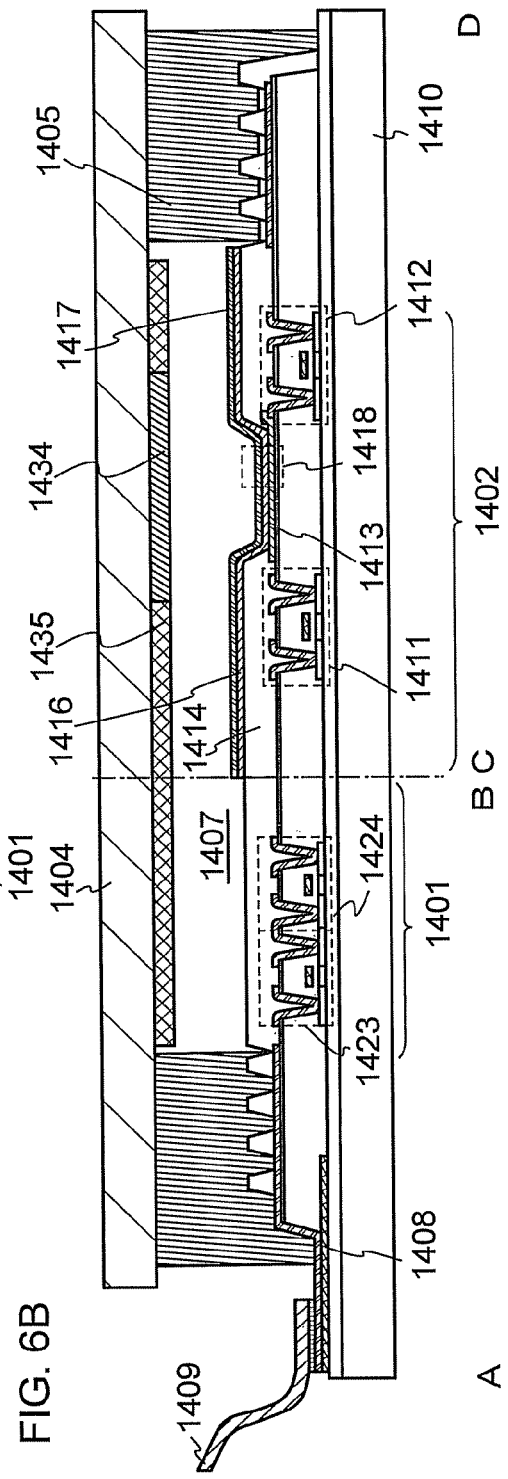
FIG. 6A
FIG. 6B

LIGHT-EMITTING ELEMENT, LIGHT-EMITTING MODULE, LIGHT-EMITTING PANEL, AND LIGHT-EMITTING DEVICE

BACKGROUND OF THE INVENTION

1. Field of the Invention

The present invention relates to a light-emitting element, a light-emitting module including the light-emitting element, a light-emitting panel including the light-emitting module, and a light-emitting device including the light-emitting panel. In particular, the present invention relates to a light-emitting element in which a layer containing a light-emitting organic compound is interposed between a pair of electrodes, a light-emitting module including the light-emitting element, a light-emitting panel including the light-emitting module, and a light-emitting device including the light-emitting panel.

2. Description of the Related Art

Mobile phones, personal computers, smartphones, e-book readers, and the like have come into widespread use, and these electronic devices have come into popular use. Moreover, these electronic devices are multifunctional, and thus are used for relatively simple work which has conventionally been done with stationery (specifically, schedule management, address listing, making notes, and the like which have conventionally been done with a datebook). As the frequency of use of these electronic devices in our life increases, a reduction in power consumption of these electronic devices is expected so that these electronic devices can be used continuously for a ling time.

Efforts have been made to reduce power consumption of a variety of electronic devices in terms of energy issues. For example, a light-emitting element with excellent energy conversion efficiency has been studied in order to reduce power consumption of lighting devices.

A light-emitting element in which a layer containing a light-emitting organic compound (also referred to as EL layer) which has a film shape is provided between a pair of electrodes is known. Such a light-emitting element is referred to as, for example, an organic EL element, and light emission can be obtained from the light-emitting organic compound when voltage is applied between the pair of electrodes. Light-emitting devices such as a lighting device and a display device including an organic EL element are known. Patent Document 1 discloses an example of a display device including an organic EL element.

Further, a structure in which light is extracted from a side opposite to an element substrate side (i.e., top emission structure) has been proposed. Patent Document 2 discloses the invention in which one of electrodes is formed using a stacked layer of a film of an alloy containing aluminum and a film containing a metal or a metal oxide.

REFERENCE

[Patent Document 1] Japanese Published Patent Application No. 2002-324673
[Patent Document 2] Japanese Published Patent Application No. 2010-153365

SUMMARY OF THE INVENTION

In a light-emitting element in which a layer containing a light-emitting organic compound is provided between a pair of electrodes, one of the pair of electrodes is preferably formed using a metal with low electrical resistance, in which case power consumption can be reduced.

However, when a high-resistance oxide film is formed on a surface of the one of the electrodes, with which the layer containing a light-emitting organic compound is in contact, a problem arises in that the driving voltage of the light-emitting element is increased.

Embodiments of the present invention are made in view of the foregoing technical background. An object of one embodiment of the present invention is to provide a light-emitting element in which loss due to electrical resistance of an electrode (reduction in voltage) is reduced. An object of one embodiment of the present invention is to provide a light-emitting module in which loss due to electrical resistance of an electrode is reduced. An object of one embodiment of the present invention is to provide a light-emitting panel in which loss due to electrical resistance of an electrode is reduced. An object of one embodiment of the present invention is to provide a light-emitting device in which loss due to electrical resistance of an electrode is reduced.

In order to achieve the above objects, one embodiment of the present invention focuses on a surface of an electrode containing a metal and a layer containing a light-emitting organic compound. The inventors have reached a structure in which a layer containing a light-emitting organic compound is provided between one electrode including a first metal, whose surface is provided with a conductive inclusion, and the other electrode. With this structure, the above objects are achieved.

In other words, one embodiment of the present invention is a light-emitting element which includes one electrode including a first metal, whose surface is provided with a conductive inclusion, the other electrode which has a property of transmitting visible light and overlaps with the one electrode, and a layer containing a light-emitting organic compound between the one electrode and the other electrode. In addition, the inclusion includes an oxide of a second metal, and a carrier-injection layer is provided between the oxide of the second metal and the layer containing a light-emitting organic compound.

One embodiment of the present invention is a light-emitting element which includes one electrode including a first metal, whose surface is provided with a conductive inclusion, the other electrode which has a property of transmitting visible light and overlaps with the one electrode, and a layer containing a light-emitting organic compound between the one electrode and the other electrode. In addition, in the light-emitting element, the inclusion includes an oxide of a second metal, and the oxide of the second metal is in contact with a carrier-injection layer provided in the layer containing a light-emitting organic compound.

According to one embodiment of the present invention, the light-emitting element includes the layer containing a light-emitting organic compound between the one electrode including the first metal, whose surface is provided with a conductive inclusion, and the other electrode. The electrical resistance of the one electrode can be reduced by providing the first metal in the one electrode, and a phenomenon in which a high-resistance oxide film is formed on a surface of the one electrode can be prevented by the conductive inclusion. As a result, a light-emitting element with less loss due to electrical resistance can be provided.

According to one embodiment of the present invention, the second metal contained in the conductive inclusion in the light-emitting element may be any one of titanium, molybdenum, tungsten, vanadium, rhenium, indium, nickel, zinc, and tin.

In the light-emitting element according to one embodiment of the present invention, the inclusion containing a metal which has excellent conductivity even in the case of being oxidized is provided over the surface of the one electrode including the first metal. This can prevent oxidation of the first metal. As a result, a metal can be used as the first metal even if a high-resistance oxide film is formed on the metal.

According to one embodiment of the present invention, the conductive inclusion in the light-emitting element may be a stack of a layer containing a second metal and a layer containing an oxide of the second metal.

According to one embodiment of the present invention, the conductive inclusion in the light-emitting element may be a stack of a granular body including a second metal and a layer which evenly covers the granular body and contains an oxide of the second metal.

According to one embodiment of the present invention, the conductive inclusion in the light-emitting element may be a granular body including a second metal and a layer containing an oxide of the second metal on a surface of the second metal.

According to one embodiment of the present invention, the carrier-injection layer in the light-emitting element may be an oxide conductive film or an organic material layer containing an acceptor material and may have a property of transmitting visible light.

In the light-emitting element according to one embodiment of the present invention, the inclusion includes the second metal, which is provided in contact with the first metal, and the oxide of the second metal, which is provided on a surface of the second metal. This can prevent oxidation of the first metal. As a result, a metal can be used as the first metal even if a high-resistance oxide film is formed on the metal.

According to one embodiment of the present invention, the first metal in the light-emitting element may be aluminum or an alloy containing aluminum and may have a thickness greater than or equal to 100 nm and less than or equal to 300 nm.

According to one embodiment of the present invention, the first metal in the light-emitting element may be an alloy containing aluminum, nickel, and lanthanum.

The light-emitting element according to one embodiment of the present invention includes the first metal containing aluminum under the surface of the one electrode. This can increase the reflectance of the one electrode. As a result, a light-emitting element in which loss of light due to absorption by the electrode is suppressed and which has excellent efficiency can be provided.

According to one embodiment of the present invention, the other electrode may have a reflectance to visible light greater than or equal to 1% and less than 100% and a transmittance to visible light greater than or equal to 1% and less than 100%.

In the light-emitting element according to one embodiment of the present invention, a micro-resonator (also referred to as microcavity) is formed between the one electrode and the other electrode. Thus, light with a specific wavelength can be extracted efficiently.

One embodiment of the present invention is a light-emitting module which includes any of the light-emitting elements and a color filter overlapping with the light-emitting element. In the light-emitting element, a layer containing a light-emitting organic compound is provided so as to emit light including light with a wavelength greater than or equal to 600 nm and less than 800 nm, light with a wavelength greater than or equal to 500 nm and less than 600 nm, and light with a wavelength greater than or equal to 400 nm and less than 500 nm.

The light-emitting module according to one embodiment of the present invention includes a light-emitting element including a layer containing a light-emitting organic compound emitting white light between a pair of electrodes, and a color filter overlapping with the light-emitting element. With this structure, light with a wavelength specified by the color filter can be extracted from the layer containing a light-emitting organic compound emitting white light. As a result, a light-emitting module which emits light of different colors can be provided without separately forming layers containing light-emitting organic compounds for individual light-emitting elements.

One embodiment of the present invention includes a plurality of the above light-emitting modules. A first light-emitting module includes a first color filter which transmits red light. The optical path length between a pair of first electrodes, i.e., one reflective electrode and the other semi-transmissive and semi-reflective electrode, is adjusted with the use of the thickness of a first carrier-injection layer so that light with a wavelength greater than or equal to 600 nm and less than 800 nm is emitted.

A second module includes a second color filter which transmits green light. The optical path length between a pair of second electrodes, i.e., one reflective electrode and the other semi-transmissive and semi-reflective electrode, is adjusted with the use of the thickness of a second carrier-injection layer so that light with a wavelength greater than or equal to 500 nm and less than 600 nm is emitted.

A third module includes a third color filter which transmits blue light. The optical path length between a pair of third electrodes, i.e., one reflective electrode and the other semi-transmissive and semi-reflective electrode, is adjusted with the use of the thickness of a third carrier-injection layer so that light with a wavelength greater than or equal to 400 nm and less than 500 nm is emitted.

One embodiment of the present invention is a light-emitting panel in which the plurality of light-emitting modules include the same layer containing a light-emitting organic compound and the one electrodes of the pair of first electrodes, the pair of second electrodes, and the pair of third electrodes are independent from one another.

The light-emitting panel according to one embodiment of the present invention includes a light-emitting module emitting red light, a light-emitting module emitting green light, and a light-emitting module emitting blue light. The light-emitting modules include light-emitting elements in which the same layer containing a light-emitting organic compound is included and loss due to electrical resistance is reduced. This makes it possible to drive the light-emitting modules emitting different colors independently of one another. As a result, a light-emitting panel which can emit light of a variety of colors can be provided.

One embodiment of the present invention is a light-emitting device including the light-emitting panel.

The light-emitting device according to one embodiment of the present invention includes a light-emitting panel which can adjust light of a variety of colors. The light-emitting panel includes a light-emitting element in which loss due to electrical resistance is reduced. This makes it possible to provide a light-emitting device and a lighting device.

Note that in this specification, an "EL layer" refers to a layer provided between a pair of electrodes in a light-emitting element. Thus, a light-emitting layer containing an organic compound that is a light-emitting substance which is interposed between electrodes is an embodiment of the EL layer.

In this specification, in the case where a substance A is dispersed in a matrix fainted using a substance B, the substance B forming the matrix is referred to as a host material, and the substance A dispersed in the matrix is referred to as a guest material. Note that the substance A and the substance B may each be a single substance or a mixture of two or more kinds of substances.

Note that a light-emitting device in this specification means an image display device, a light-emitting device, or a light source (including a lighting device). In addition, the light-emitting device includes the following modules in its category: a module in which a connector such as a flexible printed circuit (FPC), a tape automated bonding (TAB) tape, or a tape carrier package (TCP) is attached to a light-emitting device; a module having a TAB tape or a TCP provided with a printed wiring board at the end thereof; and a module having an integrated circuit (IC) directly mounted over a substrate over which a light-emitting element is formed by a chip on glass (COG) method.

According to one embodiment of the present invention, a light-emitting element in which loss due to electrical resistance is reduced can be provided. A light-emitting module in which loss due to electrical resistance is reduced can be provided. A light-emitting panel in which loss due to electrical resistance is reduced can be provided. A light-emitting device in which loss due to electrical resistance is reduced can be provided.

BRIEF DESCRIPTION OF THE DRAWINGS

FIGS. 6A and 6B illustrate a light-emitting device according to one embodiment.

DETAILED DESCRIPTION OF THE INVENTION

Figure 1A:
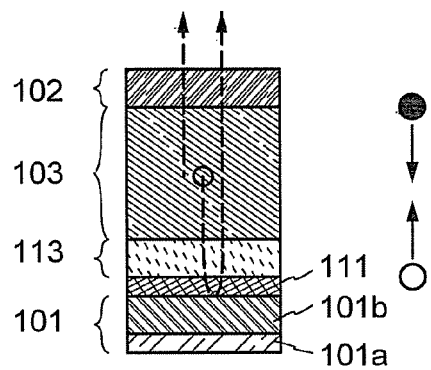
FIGS. 1A to 1E each illustrate a structure of a light-emitting element according to one embodiment.
Figure 1B:
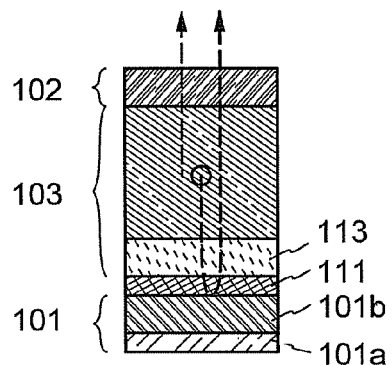

Embodiments will be described in detail with reference to the drawings. Note that the present invention is not limited to the description below, and it is easily understood by those skilled in the art that modes and details of the present invention can be modified in a variety of ways without departing from the spirit and scope of the present invention. Therefore, the present invention should not be construed as being limited to the description in the embodiments below. Note that in the structures of the present invention described below, the same portions or portions having similar functions are denoted by the same reference numerals in different drawings, and description of such portions is not repeated.

Embodiment 1

In this embodiment, a light-emitting element which includes a layer containing a light-emitting organic compound between one electrode including a first metal, whose surface is provided with a conductive inclusion, and the other electrode will be described with reference to FIGS. 1A to 1E. Specifically, a light-emitting element will be described which includes one electrode including a first metal, whose surface is provided with a conductive inclusion, the other electrode which has a property of transmitting visible light and overlaps with the one electrode, and a layer containing a light-emitting organic compound between the pair of electrodes. In the light-emitting element, the conductive inclusion includes an oxide of a second metal, and a carrier-injection layer is provided between the oxide of the second metal and the layer containing a light-emitting organic compound.

FIGS. 1A to 1E each illustrate a structure of a light-emitting element according to one embodiment of the present invention. The light-emitting elements illustrated in FIGS. 1A to 1E each include one electrode 101, the other electrode 102, and a layer 103 containing a light-emitting organic compound therebetween. The one electrode 101 may include a first metal 101b in its surface, and the first metal 101b may be stacked over a conductive material 101a. An inclusion 111 is provided in contact with the first metal 101b and is in contact with a carrier-injection layer 113.

One carrier which is one of an electron and a hole (represented by a white circle) is injected from the one electrode 101 and the other carrier which is the other of the electron and the hole (represented by a black circle) is injected from the other electrode 102 into the layer 103 containing a light-emitting organic compound (see the right side in FIG. 1A). A chain line arrow represents part of light emitted from the light-emitting organic compound excited by energy generated by recombination of the electron and the hole.

The carrier-injection layer 113 is provided in contact with the inclusion 111 and the layer 103 containing a light-emitting organic compound (see FIG. 1A). Note that the carrier-injection layer 113 may be included in part of the layer 103 containing a light-emitting organic compound (see FIG. 1B).

Next, characteristics of the light-emitting element according to one embodiment of the present invention will be described. The light-emitting element described as an example in this embodiment is characterized in that the one electrode includes the first metal and the surface of the one electrode is provided with the conductive inclusion.

<Structure of the One Electrode>

The one electrode 101 is formed to have a single-layer structure or a stacked-layer structure using a material with high conductivity, for example, a metal material such as aluminum, silver, gold, platinum, copper, molybdenum, titanium, chromium, tantalum, tungsten, neodymium, or scandium, or an alloy material containing any of these.

Further, the one electrode 101 includes the first metal 101b in its surface. The first metal 101b is preferably formed using a material with high visible light reflectance. In particular, aluminum or an alloy material containing aluminum is preferable because of high conductivity, high visible light reflectance, high degree of availability, and the like.

As examples of the alloy of aluminum, an aluminum-nickel-lanthanum alloy, an aluminum-titanium alloy, and an aluminum-neodymium alloy can be given. As examples of the alloy containing silver, a silver-neodymium alloy, a magnesium-silver alloy, and the like can be given.

When the one electrode is used as a reflective electrode, with respect to light with a wavelength greater than or equal to 400 nm and less than 800 nm, the electrode preferably has a reflectance greater than or equal to 1%, more preferably greater than or equal to 30% and less than 100%, in which case light emitted from the layer 103 containing a light-emitting organic compound can be efficiently reflected. The thickness of the one electrode is preferably greater than or equal to 100 nm and less than or equal to 300 nm. When the one electrode is used as a semi-transmissive and semi-reflective electrode, with respect to light with a wavelength greater than or equal to 400 nm and less than 800 nm, the electrode preferably has a reflectance greater than or equal to 1%, more preferably greater than or equal to 5% and less than 100%, and with respect thereto, the electrode preferably has a transmittance greater than or equal to 1%, more preferably greater than or equal to 10% and less than 100%.

<Structure of Inclusion>

The inclusion 111 contains an oxide of a second metal. As examples of the second metal, titanium, molybdenum, tungsten, vanadium, rhenium, indium, nickel, zinc, and tin can be given, and a metal which has conductivity even when oxidized can be selected.

Figure 1C:
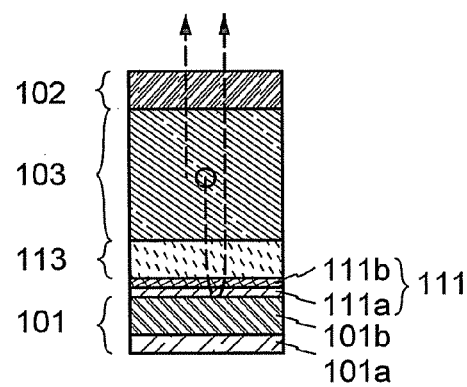
Figure 1D:
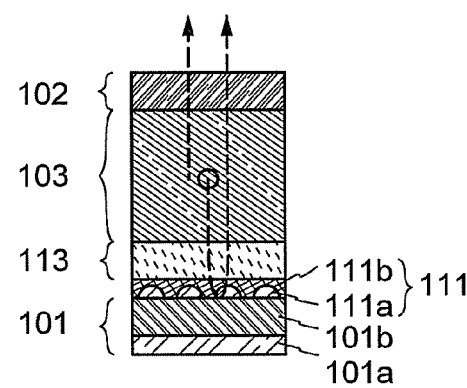
Figure 1E:
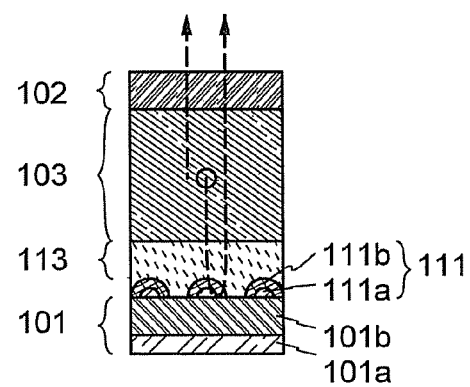

The inclusion 111 may have a single-layer structure containing the oxide of the second metal (see FIG. 1A or 1B) or a stacked-layer structure of a plurality of layers (see FIG. 1C). The inclusion 111 may also have a structure in which a component evenly covers a granular component (see FIG. 1D) or a structure in which a component is formed on a surface of a granular component (see FIG. 1E).

Next, a method of forming the inclusion 111 will be described. The inclusion 111 with a single-layer structure may be formed as follows: a second metal with an extremely small thickness, for example, approximately several nanometers is deposited in contact with the first metal 101b, and the second metal is subjected to oxidation treatment such as exposure to the air, whereby a film formed of an oxide of the second metal is formed.

The case where the inclusion 111 including a plurality of components is formed will be described. Specifically, the inclusion 111 with the structure illustrated in FIG. 1C may be formed as follows: a second metal 111a in a layer form is provided in contact with the first metal 101b, and an oxide 111b of the second metal in a layer form is stacked thereon to be in contact with the second metal 111a in a layer form. The inclusion 111 with the structure illustrated in FIG. 1D may be formed as follows: the second metal 111a in a granular form is provided in contact with the first metal 101b, and the oxide 111b of the second metal, which is in contact with and evenly covers the second metal 111a in a granular form, is stacked. The inclusion 111 with the structure illustrated in FIG. 1E may be formed as follows: the second metal 111a in a granular form is provided in contact with the first metal 101b, and the oxide 111b of the second metal is fowled on and in contact with a surface of the second metal 111a in a granular form.

<Structure of Carrier-Injection Layer>

The carrier-injection layer 113 is a layer which facilitates injection of carriers from the one electrode into the layer 103 containing a light-emitting organic compound. The carrier-injection layer 113 also serves as a layer which adjusts the optical path length between the one electrode and the other electrode. A conductive material having a property of transmitting visible light is preferably used as a material that can be used for the carrier-injection layer 113.

Specifically, an oxide conductive material having a light-transmitting property, such as indium tin oxide (ITO), indium tin oxide containing silicon or silicon oxide, indium zinc oxide, zinc oxide, or zinc oxide to which aluminum or gallium is added, can be used.

Alternatively, a conductive polymer such as poly(3,4-ethylenedioxythiophene)/poly(styrenesulfonic acid) (PEDOT/PSS) or polyaniline/poly(styrenesulfonic acid) (PAni/PSS) can be used.

A layer containing a substance having a high hole-transport property and an acceptor substance, which is provided on the one electrode side of the layer 103 containing a light-emitting organic compound, can be used as the carrier-injection layer 113.

As the substance having a high hole-transport property, any of a variety of organic compounds such as an aromatic amine compound, a carbazole derivative, an aromatic hydrocarbon, and a high molecular compound (such as an oligomer, a dendrimer, or a polymer) can be used. Specifically, a substance having a hole mobility of $10^{-6}$ cm$^2$/Vs or higher is preferable. As examples of the acceptor substance, a transition metal oxide and an oxide of a metal belonging to any of Groups 4 to 8 of the periodic table can be given. Specifically, molybdenum oxide is particularly preferable. Note that molybdenum oxide has a low hygroscopic property. Note that the acceptor substance is preferably added so that the mass ratio of the acceptor substance to the substance having a high hole-transport property is 0.1:1 to 4.0:1.

<Structure of Layer Containing Light-Emitting Organic Compound>

The layer 103 containing a light-emitting organic compound includes at least one light-emitting layer containing a light-emitting organic compound. Electrons and holes injected from the one electrode and the other electrode are recombined in the light-emitting layer containing a light-emitting organic compound. The light-emitting organic compound emits light when excited by energy generated by recombination of the electrons and the holes. Note that a structure of the layer 103 containing a light-emitting organic compound will be described in detail in Embodiment 2.

<Structure of the Other Electrode>

The other electrode has conductivity and a property of transmitting visible light. As examples of the other electrode, the following can be given: indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, and indium tin oxide to which silicon oxide is added.

A metal thin film whose thickness is set so that light is transmitted (preferably, thickness approximately greater than or equal to 5 nm and less than or equal to 30 nm) can also be used. Note that the metal thin film functions as a semi-transmissive and semi-reflective electrode.

The semi-transmissive and semi-reflective film partly reflects and partly transmits light with a wavelength greater than or equal to 400 nm and less than 800 nm. Thus, light emitted from the layer 103 containing a light-emitting organic compound can be extracted through the semi-transmissive and semi-reflective film. In particular, when the reflectance is greater than or equal to 1%, preferably greater than or equal to 5% and less than 100% and the transmittance is greater than or equal to 1%, preferably greater than or equal to 10% and less than 100%, a microresonator can be formed between a pair of the semi-transmissive and semi-reflective film and a reflective film. When a microresonator is formed between the semi-transmissive and semi-reflective film and the reflective film, light with a specific wavelength can be extracted through the semi-transmissive and semi-reflective film.

As the semi-transmissive and semi-reflective film, a metal film having a thickness through which light with a wavelength greater than or equal to 400 nm and less than 800 nm is partly reflected and partly transmitted can be used. For example, the semi-transmissive and semi-reflective film may be formed to a thickness greater than or equal to 0.1 nm and less than 100 nm, preferably greater than or equal to 5 nm and less than or equal to 30 nm, using a material similar to that of the reflective film.

Modification Example

Light-Emitting Element with Microresonator Structure

Next, a light-emitting element in which a pair of electrodes forms a microresonator (also referred to as microcavity), which is a light-emitting element according to one embodiment of the present invention, will be described with reference to FIG. 2.

Figure 2:
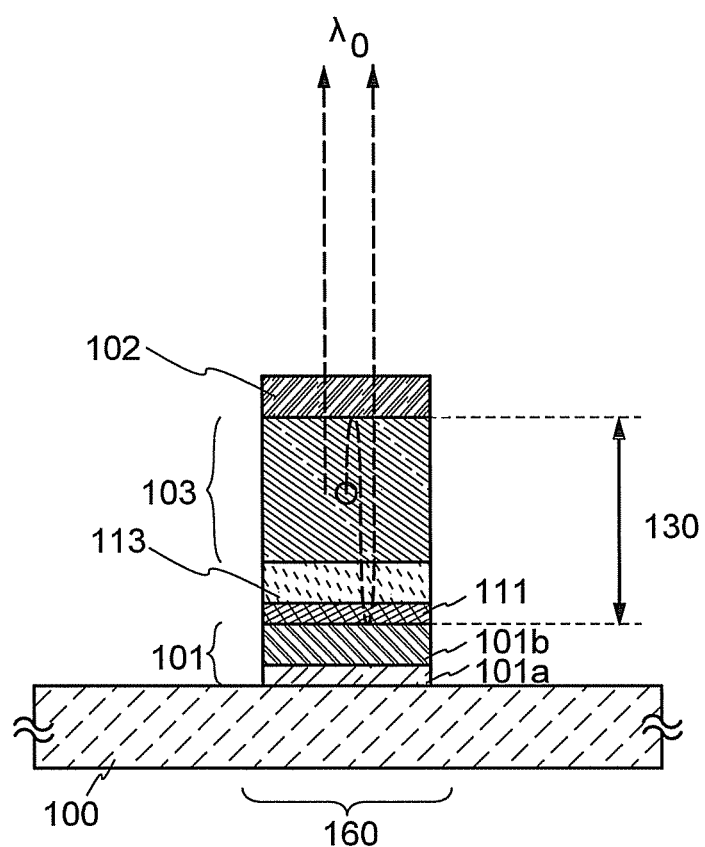
FIG. 2 illustrates a structure of a light-emitting element having a microresonator structure according to one embodiment.

A light-emitting element 160 illustrated in FIG. 2 includes the one electrode 101 which reflects visible light and the other electrode 102 which semi-transmits and semi-reflects visible light. When the optical path length between the pair of electrodes with such a structure is adjusted, light with a specific wavelength can be intensified.

The behavior of light traveling between the one reflective electrode 101 and the other semi-transmissive and semi-reflective electrode 102, the optical path length between which is adjusted, will be described with reference to FIG. 2. Light emitted from the layer 103 containing a light-emitting organic compound is repeatedly reflected by the one reflective electrode 101 and the other semi-transmissive and semi-reflective electrode 102.

In the case where the integral multiple of one-half of the wavelength of light which is repeatedly reflected corresponds to an optical path length 130 between the pair of electrodes between which a microresonator is formed, the light can be extracted from the other electrode 102 side with little loss. This is because rays of light which are repeatedly reflected in the microresonator interfere with each other so as to intensify each other.

In contrast, in the case where the value that is the sum of the integral multiple of one-half of the wavelength of light which is repeatedly reflected and one-quarter of the wavelength corresponds to the optical path length 130 between the pair of electrodes, it is difficult to extract the light from the other electrode 102 side. This is because rays of light which are repeatedly reflected in the microresonator interfere with each other so as to counteract each other.

By such an action, the wavelength (2 in FIG. 2) of light which can be efficiently extracted to the outside from light emitted from the layer 103 containing a light-emitting organic compound can be controlled by adjusting the optical path length 130. Specifically, light with a specific wavelength can be efficiently extracted by adjusting the optical path length 130 between the pair of electrodes by changing the thickness of the carrier-injection layer 113 and the layer 103 containing a light-emitting substance.

Next, a method of manufacturing a light-emitting element according to one embodiment of the present invention will be described with reference to FIGS. 3A to 3D. A method of manufacturing a light-emitting element, which is described as an example in this embodiment, is a method in which an inclusion is formed over a first metal provided on a surface of one of electrodes without exposure of the first metal to the air. When such a method is employed, a high-resistance oxide film is not formed on a surface of the first metal, so that the first metal and a second metal can be electrically connected to each other.

<Method of Manufacturing Light-Emitting Element>

The one electrode 101 is formed over a substrate 100 having an insulating surface. In this embodiment, a glass substrate is used as the substrate 100. In the one electrode 101, titanium is used as the conductive material 101a and an aluminum-nickel-lanthanum alloy as the first metal 101b is stacked over the conductive material 101a. Although both the conductive films can be formed by a sputtering method, it is particularly preferable to form the conductive films successively in an inert gas atmosphere. This is because a phenomenon in which an oxide film with high electrical resistance is formed on a surface of the first metal 101b due to exposure of the first metal 101b to the air can be prevented.

The first metal 101b contains aluminum as its main component and thus has high reflectance with respect to visible light with a wavelength from 400 nm to 800 nm.

Figure 3A:
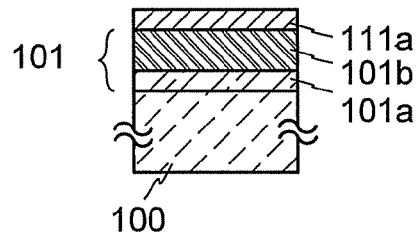
FIGS. 3A to 3D illustrate a method of manufacturing a light-emitting element according to one embodiment.

Next, a film which serves as the inclusion 111 is formed successively without exposure of the first metal 101b of the one electrode 101 to the air (see FIG. 3A). In this embodiment, a 6 nm thick titanium film is formed as a second metal film included in the inclusion 111. The second metal film included in the inclusion 111 is formed on the surface of the first metal 101b without exposure of the first metal 101b to the air; thus, a high-resistance oxide film is not formed between the first metal 101b and the second metal film included in the inclusion 111.

Figure 3B:
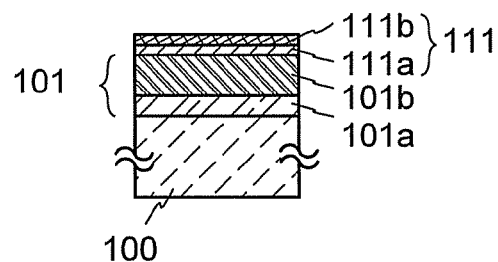
Figure 3C:
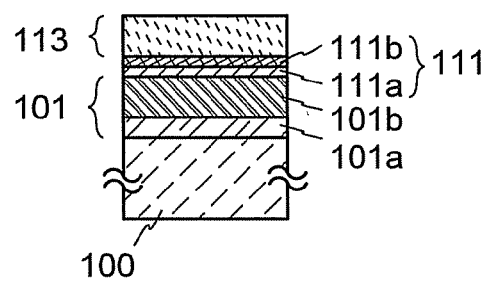

Next, the substrate 100 over which the film which serves as the inclusion 111 is formed over the one electrode 101 is carried out of a deposition apparatus (sputtering apparatus in this embodiment) to the air. At this time, the inclusion 111 is formed. Specifically, titanium which is the second metal is reacted with oxygen in the air, so that titanium oxide is formed on a surface of the second metal. FIG. 3B schematically illustrates the state at this stage. In FIG. 3B, in the inclusion 111, titanium is used as the second metal 111a on the first metal 101b side, and a titanium oxide layer is formed as the oxide 111b of the second metal over the second metal 111a. Note that the titanium oxide (TiO$_x$) layer contains oxygen atoms x satisfying 0<x<2 and is a conductive metal oxide.

Next, the carrier-injection layer 113 is formed over the inclusion 111. In this embodiment, as the carrier-injection layer 113, an indium tin oxide film is formed by a sputtering method (see FIG. 3C). An indium tin oxide film contains oxygen and is formed using a sputtering gas containing oxygen. Thus, when an indium tin oxide film is formed in contact with a metal, an interface therebetween is easily oxidized. However, in this embodiment, the inclusion 111 which has been oxidized is formed on the surface of the one electrode 101; thus, a high-resistance oxide film is not formed even when an indium tin oxide film is formed.

Note that the same applies to the case where an organic material layer containing an acceptor material is formed as the carrier-injection layer 113; a high-resistance oxide film is not formed.

Next, the layer 103 containing a light-emitting organic compound is formed by a vacuum evaporation method.

Figure 3D:
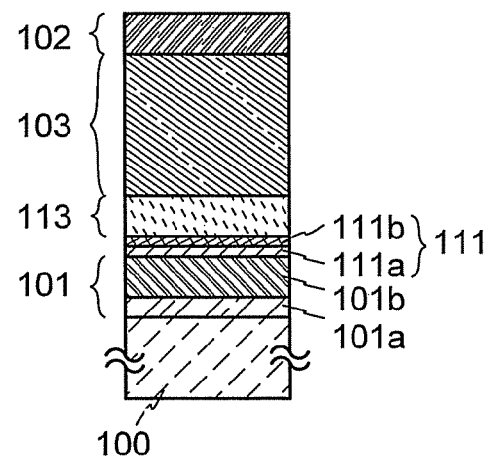

Next, magnesium and silver are co-evaporated over the layer 103 containing an organic compound by a vacuum evaporation method, whereby a semi-transmissive and semi-reflective film is formed as the other electrode 102 (see FIG. 3D).

Modification Example

Note that in this embodiment, the carrier-injection layer 113 may be formed successively without exposure of the substrate 100 over which the second metal film included in the inclusion 111 is formed over the one electrode 101 to the air. When this method is employed, the carrier-injection layer 113 is formed before the second metal film included in the inclusion 111 is oxidized. Even in such a structure, when the carrier-injection layer 113 (e.g., an oxide conductive film or an organic material layer containing an acceptor material) which is capable of oxidizing the second metal is formed, the surface of the second metal included in the inclusion 111 is oxidized, so that a conductive oxide is contained in the inclusion 111. Therefore, a similar effect can be obtained.

The light-emitting element according to one embodiment of the present invention includes the layer containing a light-emitting organic compound between the one electrode including the first metal, whose surface is provided with the conductive inclusion, and the other electrode. The electrical resistance of the one electrode can be reduced by providing the first metal as the one electrode, and a phenomenon in which a high-resistance oxide film is formed on a surface of the one electrode can be prevented by the conductive inclusion. As a result, a light-emitting element in which loss due to electrical resistance is reduced can be provided.

In the light-emitting element according to one embodiment of the present invention, the inclusion which contains a metal which has excellent conductivity even when oxidized is provided for the first metal included in the surface of the one electrode. This can prevent oxidation of the first metal. Thus, even a metal on which an oxide film with high electrical resistance is formed can be used as the first metal.

The light-emitting element according to one embodiment of the present invention includes the inclusion containing the second metal provided in contact with the first metal and the oxide of the second metal on a surface of the second metal. This can prevent oxidation of the first metal. Thus, even a metal on which an oxide film with high electrical resistance is formed can be used as the first metal.

In the light-emitting element according to one embodiment of the present invention, the first metal containing aluminum is included in the surface of the one electrode. This can increase the reflectance of the one electrode. As a result, a light-emitting element whose loss of light due to absorption by the electrode is suppressed and efficiency is excellent can be provided.

In the light-emitting element according to one embodiment of the present invention, a microresonator (or a microcavity) is formed between the one electrode and the other electrode. This makes it possible to efficiently extract light with a specific wavelength.

Note that this embodiment can be combined with any of the other embodiments in this specification as appropriate.

Embodiment 2

In this embodiment, an example of a structure of a layer containing a light-emitting organic compound interposed between a pair of electrodes, which can be used in a light-emitting element of one embodiment of the present invention which includes a layer containing a light-emitting organic compound between one electrode including a first metal, whose surface is provided with a conductive inclusion, and the other electrode, will be described with reference to FIGS. 4A to 4E.

The light-emitting element described as an example in this embodiment includes a first electrode, a second electrode, and a layer containing a light-emitting organic compound (hereinafter referred to as EL layer) provided between the first electrode and the second electrode. One of the first electrode and the second electrode serves as an anode, and the other serves as a cathode. The EL layer is provided between the first electrode and the second electrode, and a structure of the EL layer may be selected as appropriate in accordance with materials of the first electrode and the second electrode. Examples of the structure of the light-emitting element will be described below; needless to say, the structure of the light-emitting element is not limited to the examples.

Structure Example 1 of Light-Emitting Element

Figure 4A:
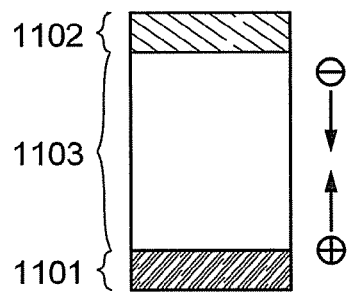
FIGS. 4A to 4E each illustrate a structure of a light-emitting element according to one embodiment.

An example of a structure of a light-emitting element is illustrated in FIG. 4A. In the light-emitting element illustrated in FIG. 4A, an EL layer is provided between an anode 1101 and a cathode 1102.

When voltage higher than the threshold voltage of the light-emitting element is applied between the anode 1101 and the cathode 1102, holes are injected to the EL layer from the anode 1101 side and electrons are injected to the EL layer from the cathode 1102 side. The injected electrons and holes are recombined in the EL layer, so that a light-emitting substance contained in the EL layer emits light.

In this specification, a layer or a stacked body which includes one region where electrons and holes injected from both ends are recombined is referred to as a light-emitting unit. Therefore, it can be said that Structure Example 1 of the light-emitting element includes one light-emitting unit.

A light-emitting unit 1103 may include at least a light-emitting layer containing a light-emitting substance, and may have a structure in which the light-emitting layer and a layer other than the light-emitting layer are stacked. Examples of the layer other than the light-emitting layer include a layer containing a substance having a high hole-injection property, a layer containing a substance having a high hole-transport property, a layer containing a substance having a poor hole-transport property (a substance which blocks holes), a layer containing a substance having a high electron-transport property, a layer containing a substance having a high electron-injection property, and a layer containing a substance having a bipolar property (a substance having a high electron-transport property and a high hole-transport property).

Figure 4B:
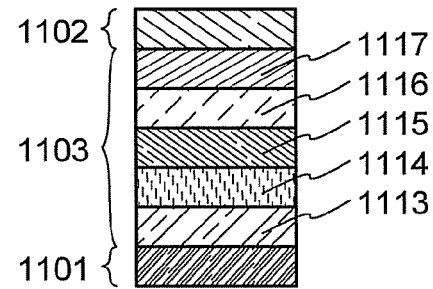

An example of a specific structure of the light-emitting unit 1103 is illustrated in FIG. 4B. In the light-emitting unit 1103 illustrated in FIG. 4B, a hole-injection layer 1113, a hole-transport layer 1114, a light-emitting layer 1115, an electron-transport layer 1116, and an electron-injection layer 1117 are stacked in this order from the anode 1101 side.

Structure Example 2 of Light-Emitting Element

Figure 4C:
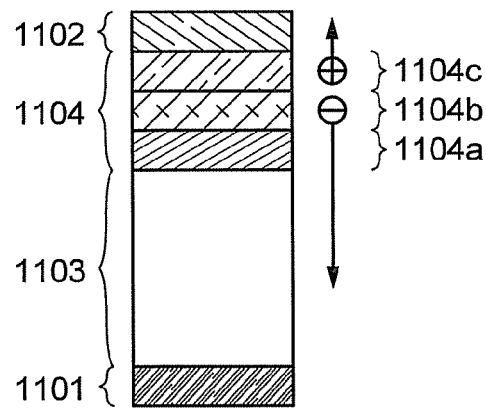

Another example of a structure of a light-emitting element is illustrated in FIG. 4C. In the light-emitting element illustrated in FIG. 4C, an EL layer including the light-emitting unit 1103 is provided between the anode 1101 and the cathode 1102. Further, an intermediate layer 1104 is provided between the cathode 1102 and the light-emitting unit 1103. Note that a structure similar to that of the light-emitting unit included in Structure Example 1 of the light-emitting element, which is described above, can be applied to the light-emitting unit 1103 in Structure Example 2 of the light-emitting element and that the description of Structure Example 1 of the light-emitting element can be referred to for the details.

The intermediate layer 1104 may be formed to include at least a charge generation region, and may have a structure in which the charge generation region and a layer other than the charge generation region are stacked. For example, a structure can be employed in which a first charge generation region 1104c, an electron-relay layer 1104b, and an electron-injection buffer 1104a are stacked in this order from the cathode 1102 side.

The behavior of electrons and holes in the intermediate layer 1104 will be described. When voltage higher than the threshold voltage of the light-emitting element is applied between the anode 1101 and the cathode 1102, holes and electrons are generated in the first charge generation region 1104c, and the holes move into the cathode 1102 and the electrons move into the electron-relay layer 1104b. The electron-relay layer 1104b has a high electron-transport property and immediately transfers the electrons generated in the first charge generation region 1104c to the electron-injection buffer 1104a. The electron-injection buffer 1104a can reduce a barrier against electron injection into the light-emitting unit 1103, so that the efficiency of the electron injection into the light-emitting unit 1103 can be improved. Thus, the electrons generated in the first charge generation region 1104c are injected into the LUMO level of the light-emitting unit 1103 through the electron-relay layer 1104b and the electron-injection buffer 1104a.

In addition, the electron-relay layer 1104b can prevent interaction in which the substance contained in the first charge generation region 1104c and the substance included in the electron-injection buffer 1104a react with each other at the interface therebetween to impair the functions of the electron-injection buffer 1104a and the first charge generation region 1104c.

The range of choices of materials that can be used for the cathode in Structure Example 2 of the light-emitting element is wider than that of materials that can be used for the cathode in Structure Example 1 of the light-emitting element. This is because the cathode in Structure Example 2 can be formed using a material having a relatively high work function as long, as the cathode receives holes generated in the intermediate layer.

Structure Example 3 of Light-Emitting Element

Figure 4D:
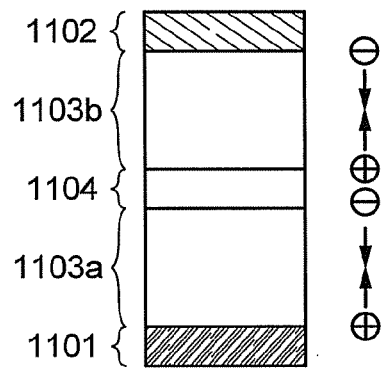
Figure 4E:
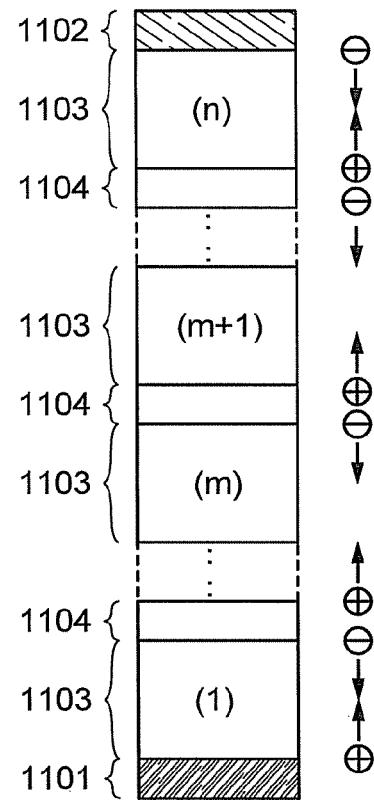

Another example of the structure of a light-emitting element is illustrated in FIG. 4D. In the light-emitting element illustrated in FIG. 4D, an EL layer including two light-emitting units is provided between the anode 1101 and the cathode 1102. Furthermore, the intermediate layer 1104 is provided between a first light-emitting unit 1103a and a second light-emitting unit 1103b.

Note that the number of the light-emitting units provided between the anode and the cathode is not limited to two. A light-emitting element illustrated in FIG. 4E has a structure in which a plurality of light-emitting units 1103 are stacked, that is, a so-called tandem structure. Note that in the case where n (n is a natural number greater than or equal to 2) light-emitting units 1103 are provided between the anode and the cathode, the intermediate layer 1104 is provided between an m-th (in is a natural number greater than or equal to 1 and less than or equal to n−1) light-emitting unit and an (m+1)-th light-emitting unit.

Note that a structure similar to that in Structure Example 1 of the light-emitting element can be applied to the light-emitting unit 1103 in Structure Example 3 of the light-emitting element; a structure similar to that in Structure Example 2 of the light-emitting element can be applied to the intermediate layer 1104 in Structure Example 3 of the light-emitting element. Therefore, the description of Structure Example 1 of the light-emitting element or the description of Structure Example 2 of the light-emitting element can be referred to for the details.

The behavior of electrons and holes in the intermediate layer 1104 provided between the light-emitting units will be described. When voltage higher than the threshold voltage of the light-emitting element is applied between the anode 1101 and the cathode 1102, holes and electrons are generated in the intermediate layer 1104, and the holes move into the light-emitting unit provided on the cathode 1102 side and the electrons move into the light-emitting unit provided on the anode side. The holes injected into the light-emitting unit provided on the cathode side are recombined with the electrons injected from the cathode side, so that a light-emitting substance contained in the light-emitting unit emits light. The electrons injected into the light-emitting unit provided on the anode side are recombined with the holes injected from the anode side, so that a light-emitting substance contained in the light-emitting unit emits, light. Thus, the holes and electrons generated in the intermediate layer 1104 cause light emission in the respective light-emitting units.

Note that the light-emitting units can be provided in contact with each other when these light-emitting units allow the same structure as the intermediate layer to be formed therebetween. Specifically, when one surface of the light-emitting unit is provided with a charge generation region, the charge generation region functions as a first charge generation region of the intermediate layer; thus, the light-emitting units can be provided in contact with each other.

Structure Examples 1 to 3 of the light-emitting element can be implemented in combination. For example, an intermediate layer may be provided between the cathode and the light-emitting unit in Structure Example 3 of the light-emitting element.

<Material for Light-Emitting Element>

Next, specific materials that can be used for the light-emitting elements having the above structures will be described; materials for the anode, the cathode, and the EL layer will be described in this order.

<Material for Anode>

The anode 1101 is preferably formed using a metal, an alloy, an electrically conductive compound, a mixture of these materials, or the like which has a high work function (specifically, a work function of 4.0 eV or higher). Specific examples are indium tin oxide (ITO), indium tin oxide containing silicon or silicon oxide, indium zinc oxide, indium oxide containing tungsten oxide and zinc oxide, and the like.

Films of these conductive metal oxides are usually formed by a sputtering method, but may also be formed by application of a sol-gel method or the like. For example, an indium-zinc oxide film can be formed by a sputtering method using a target in which zinc oxide is added to indium oxide at greater than or equal to 1 wt % and less than or equal to 20 wt %. A film of indium oxide containing tungsten oxide and zinc oxide can be formed by a sputtering method using a target in which tungsten oxide and zinc oxide are added to indium oxide at greater than or equal to 0.5 wt % and less than or equal to 5 wt % and greater than or equal to 0.1 wt % and less than or equal to 1 wt %, respectively.

Besides, as examples of the material for the anode 1101, the following can be given: gold (Au), platinum (Pt), nickel (Ni), tungsten (W), chromium (Cr), molybdenum (Mo), iron (Fe), cobalt (Co), copper (Cu), palladium (Pd), titanium (Ti), nitride of a metal material (e.g., titanium nitride), molybdenum oxide, vanadium oxide, ruthenium oxide, tungsten oxide, manganese oxide, titanium oxide, and the like. A conductive polymer such as poly(3,4-ethylenedioxythiophene)/poly(styrenesulfonic acid) (PEDOT/PSS) or polyaniline/poly(styrenesulfonic acid) (PAni/PSS) may also be used.

Note that in the case where a second charge generation region is provided in contact with the anode 1101, a variety of conductive materials can be used for the anode 1101 regardless of their work functions. Specifically, besides a material which has a high work function, a material which has a low work function can also be used. Materials for forming the second charge generation region will be described later together with materials for forming the first charge generation region.

<Material for Cathode>

In the case where the first charge generation region 1104c is provided between the cathode 1102 and the light-emitting unit 1103 to be in contact with the cathode 1102, a variety of conductive materials can be used for the cathode 1102 regardless of their work functions.

Note that at least one of the cathode 1102 and the anode 1101 is formed using a conductive film that transmits visible light. For the conductive film which transmits visible light, for example, indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, and indium tin oxide to which silicon oxide is added can be given. Further, a metal thin film whose thickness is set so that light is transmitted (preferably, thickness approximately greater than or equal to 5 nm and less than or equal to 30 nm) can also be used.

<Material for EL Layer>

Specific examples of materials for the layers included in the light-emitting unit 1103 will be given below.

The hole-injection layer is a layer containing a substance having a high hole-injection property. As the substance having a high hole-injection property, for example, molybdenum oxide, vanadium oxide, ruthenium oxide, tungsten oxide, manganese oxide, or the like can be used. In addition, it is possible to use a phthalocyanine-based compound such as phthalocyanine ($H_2Pc$) or copper phthalocyanine (CuPc), a high molecule such as poly(3,4-ethylenedioxythiophene)/poly(styrenesulfonate) (PEDOT/PSS), or the like to form the hole-injection layer.

Note that the hole-injection layer may be formed using the second charge generation region. When the second charge generation region is used for the hole-injection layer, a variety of conductive materials can be used for the anode 1101 regardless of their work functions as described above. Materials for forming the second charge generation region will be described later together with materials for forming the first charge generation region.

<Hole-Transport Layer>

The hole-transport layer is a layer containing a substance having a high hole-transport property. The hole-transport layer may have a stacked layer of two or more layers containing a substance having a high hole-transport property without limitation to a single layer. A substance having a hole-transport property higher than an electron-transport property is used. In particular, a substance having a hole mobility of $10^{-6}$ $cm^2/Vs$ or higher is preferably used, in which case the driving voltage of the light-emitting element can be reduced.

<Light-Emitting Layer>

The light-emitting layer is a layer containing a light-emitting substance. The light-emitting layer may have a stacked layer of two or more layers containing a light-emitting substance without limitation to a single layer. A fluorescent compound or a phosphorescent compound can be used as the light-emitting substance. A phosphorescent compound is preferably used as the light-emitting substance, in which case the emission efficiency of the light-emitting element can be increased.

The light-emitting substance is preferably dispersed in a host material. A host material preferably has higher excitation energy than the light-emitting substance.

<Electron-Transport Layer>

The electron-transport layer is a layer containing a substance having a high electron-transport property. The electron-transport layer may have a stacked layer of two or more layers containing a substance having a high electron-transport property without limitation to a single layer. A substance having an electron-transport property higher than a hole-transport property is used. In particular, a substance having an electron mobility of $10^{-6}$ $cm^2/Vs$ or higher is preferably used, in which case the driving voltage of the light-emitting element can be reduced.

<Electron-Injection Layer>

The electron-injection layer is a layer containing a substance having a high electron-injection property. The electron-injection layer may have a stacked layer of two or more layers containing a substance having a high electron-injection property without limitation to a single layer. The electron-injection layer is preferably provided, in which case the efficiency of electron injection from the cathode 1102 can be increased, so that the driving voltage of the light-emitting element can be reduced.

<Material for Charge Generation Region>

The first charge generation region 1104c and the second charge generation region are regions containing a substance having a high hole-transport property and an acceptor substance. The charge generation region may contain a substance having a high hole-transport property and an acceptor substance in the same film or may be a stack of a layer containing a substance having a high hole-transport property and a layer containing an acceptor substance. Note that in the case of a stacked-layer structure in which the first charge generation region is provided on the cathode side, the layer containing the substance having a high hole-transport property is in contact with the cathode 1102, and in the case of a stacked-layer structure in which the second charge generation region is provided on the anode side, the layer containing an acceptor substance is in contact with the anode 1101.

Note that the acceptor substance is preferably added to the charge generation region so that the mass ratio of the acceptor substance to the substance having a high hole-transport property is from 0.1:1 to 4.0:1.

As the acceptor substance that is used for the charge generation region, a transition metal oxide and an oxide of a metal belonging to any of Groups 4 to 8 of the periodic table can be given. Specifically, molybdenum oxide is particularly preferable. Note that molybdenum oxide has a low hygroscopic property.

As the substance having a high hole-transport property that is used for the charge generation region, any of a variety of organic compounds such as an aromatic amine compound, a carbazole derivative, an aromatic hydrocarbon, and a high molecular compound (such as an oligomer, a dendrimer, or a polymer) can be used. Specifically, a substance having a hole mobility of $10^{-6}$ $cm^2/Vs$ or higher is preferably used. Note that any other substance may be used as long as the hole transport property thereof is higher than the electron-transport property thereof.

<Material for Electron-Relay Layer>

The electron-relay layer 1104b is a layer that can immediately receive electrons extracted by the acceptor substance in the first charge generation region 1104c. Therefore, the electron-relay layer 1104b is a layer containing a substance having a high electron-transport property, and the LUMO level of the electron-relay layer 1104b is positioned between the acceptor level of the acceptor substance in the first charge generation region 1104c and the LUMO level of the light-emitting unit 1103 with which the electron-relay layer is in contact. Specifically, it is preferable that the LUMO level of the electron-relay layer 1104b be approximately greater than or equal to −5.0 eV and less than or equal to −3.0 eV.

As examples of the substance used for the electron-relay layer 1104b, a perylene derivative and a nitrogen-containing condensed aromatic compound can be given. Note that a nitrogen-containing condensed aromatic compound is preferably used for the electron-relay layer 1104b because of its stability. Among nitrogen-containing condensed aromatic compounds, a compound having an electron-withdrawing group such as a cyano group or a fluoro group is preferably used, in which case electrons can be received more easily in the electron-relay layer 1104b.

<Material for Electron-Injection Buffer>

The electron-injection buffer 1104a is a layer which facilitates electron injection from the first charge generation region 1104c into the light-emitting unit 1103. By providing the electron-injection buffer 1104a between the first charge generation region 1104c and the light-emitting unit 1103, the injection barrier therebetween can be reduced.

Any of the following substances having a high electron-injection property can be used for the electron-injection buffer 1104a: an alkali metal, an alkaline earth metal, a rare earth metal, a compound of the above metal (e.g., an alkali metal compound (e.g., an oxide such as lithium oxide, a halide, and a carbonate such as lithium carbonate or cesium carbonate), an alkaline earth metal compound (e.g., an oxide, a halide, and a carbonate), a rare earth metal compound (e.g., an oxide, a halide, and a carbonate)), and the like.

Further, in the case where the electron-injection buffer 1104a contains a substance having a high electron-transport property and a donor substance, the donor substance is preferably added so that the mass ratio of the donor substance to the substance having a high electron-transport property is from 0.001:1 to 0.1:1. Note that as the donor substance, an organic compound such as tetrathianaphthacene (abbreviation: TTN), nickelocene, or decamethylnickelocene can be used as well as an alkali metal, an alkaline earth metal, a rare earth metal, a compound of the above metal (e.g., an alkali metal compound (e.g., an oxide such as lithium oxide, a halide, and a carbonate such as lithium carbonate or cesium carbonate), an alkaline earth metal compound (e.g., an oxide, a halide, and a carbonate), and a rare earth metal compound (e.g., an oxide, a halide, and a carbonate). Note that as the substance having a high electron-transport property, a material similar to the above material for the electron-transport layer which can be formed in part of the light-emitting unit 1103 can be used.

<Method of Manufacturing Light-Emitting Element>

A method of manufacturing the light-emitting element will be described. Over the first electrode, the layers described above are combined as appropriate to form an EL layer. Any of a variety of methods (e.g., a dry process or a wet process) can be used for the EL layer depending on the material for the EL layer. For example, a vacuum evaporation method, an inkjet method, a spin coating method, or the like may be selected. Note that a different method may be employed for each layer. A second electrode is formed over the EL layer. In the above manner, the light-emitting element is manufactured.

The light-emitting element described in this embodiment can be manufactured by combining the above materials. Light emission from the above light-emitting substance can be obtained with this light-emitting element, and the emission color can be selected by changing the type of the light-emitting substance. Further, when a plurality of light-emitting substances which emit light of different colors are used, the width of the emission spectrum can be expanded, so that, for example, white light emission can be obtained.

Note that in order to obtain white light emission, for example, a structure may be employed in which at least two layers containing light-emitting substances are provided so that light of complementary colors is emitted. Specific examples of complementary colors are a combination of blue and yellow, a combination of blue-green and red, and the like.

Further, in order to obtain white light emission with an excellent color rendering property, an emission spectrum needs to spreads through the entire visible light region. For example, layers emitting light of blue, green, and red may be provided.

Note that this embodiment can be combined with any of the other embodiments in this specification as appropriate.

Embodiment 3

In this embodiment, a light-emitting module and a light-emitting panel each of which includes the light-emitting element of one embodiment of the present invention, which includes a layer containing a light-emitting organic compound between one electrode including a first metal, whose surface is provided with a conductive inclusion, and the other electrode, will be described with reference to FIGS. 5A and 5B.

Specifically, a light-emitting module will be described which includes a light-emitting element including a layer containing a light-emitting organic compound so as to emit light including light with a wavelength greater than or equal to 600 nm and less than 800 nm, light with a wavelength greater than or equal to 500 nm and less than 600 nm, and light with a wavelength greater than or equal to 400 nm and less than 500 nm, and a color filter overlapping with the light-emitting element. In addition, a light-emitting panel including a plurality of the light-emitting modules will be described.

Figure 5A:
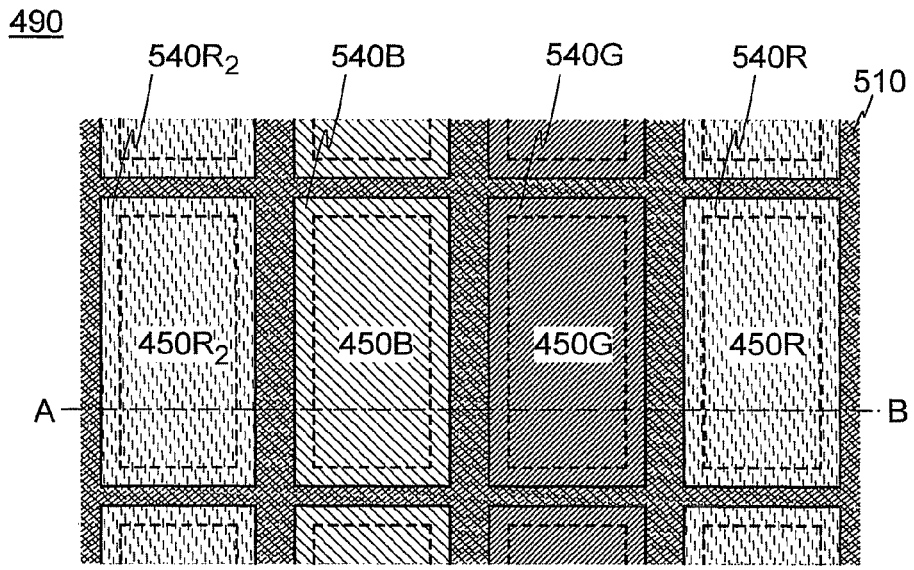
FIGS. 5A and 5B illustrate a light-emitting panel according to one embodiment.
Figure 5B:
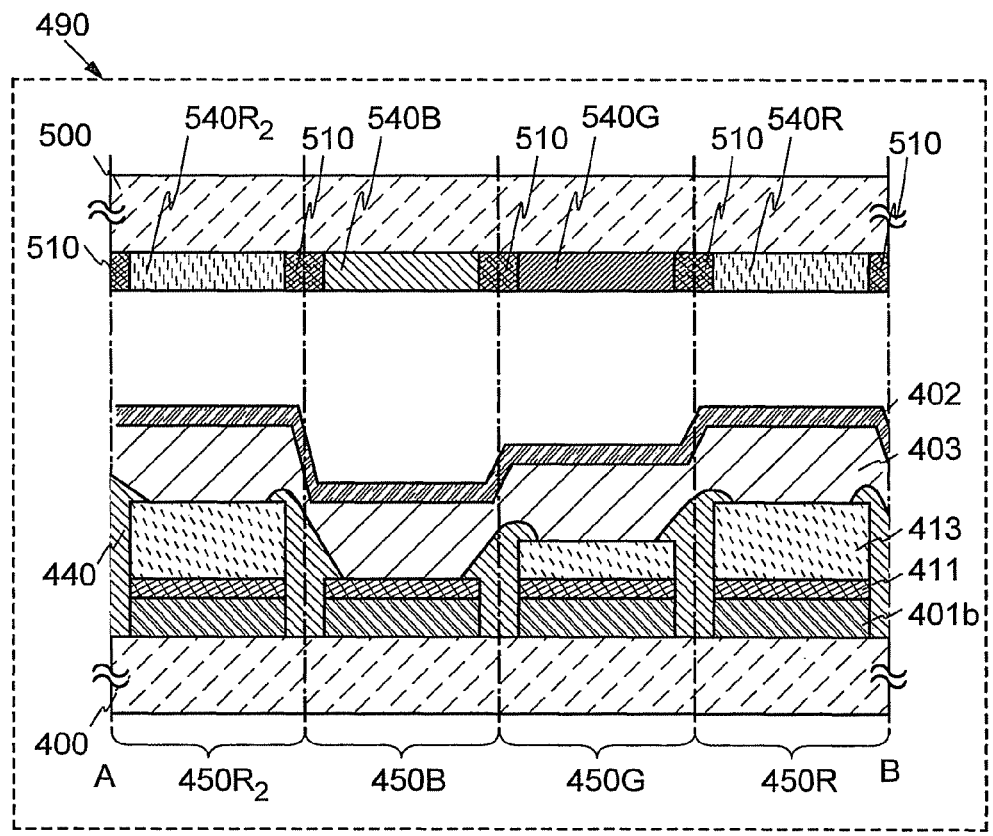

FIGS. 5A and 5B illustrate a light-emitting module described as an example in this embodiment and a light-emitting panel including a plurality of the light-emitting modules. A light-emitting panel 490 includes a first light-emitting module 450R, a second light-emitting module 450G, a third light-emitting module 450B, and a fourth light-emitting module $450R_2$.

<Structure of Light-Emitting Module>

A structure of the light-emitting module will be described using the first light-emitting module 450R. The first light-emitting module 450R includes a layer 403 containing a light-emitting organic compound between a pair of first electrodes, i.e., one electrode including a first metal 401b, whose surface is provided with an inclusion 411, and the other electrode 402. In addition, an oxide of a second metal is included in the inclusion 411, and a carrier-injection layer 413 is provided between the oxide of the second metal and the layer containing a light-emitting organic compound. Here, the layer 403 containing a light-emitting organic compound is interposed between the one electrode over a substrate 400 and the other electrode 402, so that a light-emitting element is formed. In addition, a color filter 540R provided for a substrate 500 is provided on the other electrode side so as to overlap with the light-emitting element. Note that any of the light-emitting elements described in Embodiment 1 can be used in the light-emitting module described as an example in this embodiment.

The carrier-injection layer 413 also serves as an optical adjustment layer which adjusts the optical path length between the pair of first electrodes, i.e., the one electrode and the other electrode 402. In this embodiment, as the carrier-injection layer 413, a conductive film which has a property of transmitting visible light is provided in contact with the inclusion 411.

Note that a partition wall 440 having an opening portion on the carrier-injection layer 413 is provided so as to cover an end portion of the carrier-injection layer 413.

The layer 403 containing a light-emitting organic compound is provided so as to emit white light including light with a wavelength greater than or equal to 600 nm and less than 800 nm, light with a wavelength greater than or equal to 500 nm and less than 600 nm, and light with a wavelength greater than or equal to 400 nm and less than 500 nm. Note that the description in Embodiment 2 is referred to for the detail of the layer 403 containing a light-emitting organic compound.

The light-emitting module according to one embodiment of the present invention includes the light-emitting element including a layer containing a light-emitting organic compound which emits white light between the pair of electrodes, and the color filter overlapping with the light-emitting element. With this structure, light with a wavelength specified by the color filter can be extracted from the layer containing a light-emitting organic compound which emits white light. As a result, light-emitting modules which emit light of different colors can be provided without separately forming layers containing light-emitting organic compounds.

<Structure of Light-Emitting Panel>

The light-emitting panel 490 includes the first light-emitting module 450R, the second light-emitting module 450G, the third light-emitting module 450B, and the fourth light-emitting module 450R$_2$.

In the first light-emitting module 450R, the first color filter 540R which transmits red light is provided, and the optical path length between a pair of first electrodes, i.e., one reflective electrode and the other semi-transmissive and semi-reflective electrode, is adjusted with the use of the thickness of a first carrier-injection layer so that light with a wavelength greater than or equal to 600 nm and less than 800 nm is emitted.

In the second light-emitting module 450G, a second color filter 540G which transmits green light is provided, and the optical path length between a pair of second electrodes, i.e., one reflective electrode and the other semi-transmissive and semi-reflective electrode, is adjusted with the use of the thickness of a second carrier-injection layer so that light with a wavelength greater than or equal to 500 nm and less than 600 nm is emitted.

In the third light-emitting module 450B, a third color filter 540B which transmits blue light is provided, and the optical path length between a pair of third electrodes, i.e., one reflective electrode and the other semi-transmissive and semi-reflective electrode, is adjusted with the use of the thickness of the layer 403 containing a light-emitting organic compound so that light with a wavelength greater than or equal to 400 nm and less than 500 nm is emitted.

The fourth light-emitting module 450R$_2$ has the same structure as the first light-emitting module 450R except that a fourth color filter 540R$_2$ which transmits red light is provided.

Note that the color filters are separated by a light-blocking film 510 (also referred to as black matrix). Note that in this embodiment, a structure in which Ni—Al—La is used as a first metal of the one electrode, a titanium layer is used as a second metal in contact with the first metal, and titanium oxide (TiO$_x$) (0<x<2) is formed as an inclusion on a surface of the titanium is preferably employed. This is because the formation of an oxide film with high electrical resistance can be prevented and high reflectance can be obtained. Further, the carrier-injection layers in the light-emitting modules are each formed using indium tin oxide (ITO) processed by photolithography. Such a structure makes it possible to manufacture high-definition light-emitting modules which emit light of different colors in an integrated manner.

The light-emitting panel according to one embodiment of the present invention includes the light-emitting module which emits red light, the light-emitting module which emits green light, and the light-emitting module which emits blue light. The light-emitting modules include light-emitting elements which include the same layer containing a light-emitting organic compound and in each of which loss due to electrical resistance is reduced. This can separately drive the light-emitting modules which emit light of different colors. As a result, a light-emitting panel which can adjust light of a variety of colors can be provided.

Note that this embodiment can be combined with any of the other embodiments in this specification as appropriate.

Embodiment 4

In this embodiment, a light-emitting device which includes a light-emitting panel including a light-emitting element including a layer containing a light-emitting organic compound between one electrode including a first metal, whose surface is provided with a conductive inclusion, and the other electrode will be described with reference to FIGS. 6A and 6B and FIGS. 7A and 7B. Specifically, an active matrix light-emitting device and a passive matrix light-emitting device will be described.

<Active Matrix Light-Emitting Device>

A structure in which the light-emitting panel according to one embodiment of the present invention is applied to an active matrix light-emitting device is illustrated in FIGS. 6A and 6B. Note that FIG. 6A is a top view of the light-emitting device, and FIG. 6B is a cross-sectional view taken along lines A-B and C-D in FIG. 6A.

An active matrix light-emitting device 1400 includes a driver circuit portion (source side driver circuit) 1401, a pixel portion 1402, a driver circuit portion (gate side driver circuit) 1403, a sealing substrate 1404, and a sealant 1405 (see FIG. 6A). Note that a portion enclosed by the sealant 1405 is a space.

The light-emitting device 1400 receives a video signal, a clock signal, a start signal, a reset signal, and the like from an FPC (flexible printed circuit) 1409 that is an external input terminal. Note that although only the FPC is illustrated here, the FPC may be provided with a printed wiring board (PWB). The light-emitting device in this specification includes, in its category, not only a light-emitting device itself but also a light-emitting device provided with an FPC or a PWB.

Next, the structure of the light-emitting device 1400 will be described with reference to the cross-sectional view of FIG. 6B. The light-emitting device 1400 includes a driver circuit portion including the source side driver circuit 1401 illustrated over an element substrate 1410 and the pixel portion 1402 including a pixel illustrated. Further, the light-emitting device 1400 includes a lead wiring 1408 for transmitting signals that are to be inputted to the source side driver circuit 1401 and the gate side driver circuit 1403.

Note that although the source side driver circuit 1401 includes a CMOS circuit in which an n-channel transistor 1423 and a p-channel transistor 1424 are combined in this embodiment, the driver circuit is not limited to this structure and may be any of a variety of circuits, such as a CMOS circuit, a PMOS circuit, or an NMOS circuit. Although a driver-integrated type in which a driver circuit is formed over the substrate is described in this embodiment, the present invention is not limited thereto, and the driver circuit can be formed not over the substrate but outside the substrate.

Note that any of a variety of semiconductors can be used for a region where a channel of a transistor is formed. Specifically, an oxide semiconductor or the like can be used as well as amorphous silicon or polysilicon.

<Structure Using SOI Substrate>

A single crystal semiconductor can be used in a region where a channel of a transistor is formed. When a single crystal semiconductor is used for a channel formation region, the size of the transistor can be reduced, which results in higher resolution pixels in a display portion.

As a single crystal semiconductor used for forming a semiconductor layer, a semiconductor substrate, typical examples of which include a single crystal semiconductor substrate formed using elements belonging to Group 14, such as a single crystal silicon substrate, a single crystal germanium substrate, or a single crystal silicon germanium substrate, and a compound semiconductor substrate (e.g., a SiC substrate, a sapphire substrate, and a GaN substrate), can be used. Preferred one is a silicon-on-insulator (SOI) substrate in which a single crystal semiconductor layer is provided on an insulating surface.

As a method of forming the SOI substrate, any of the following methods can be used: a method in which oxygen ions are implanted into a mirror-polished wafer and then heating is performed at a high temperature, whereby an oxide layer is formed at a certain depth from a surface of the wafer and a defect caused in the surface layer is eliminated; a method in which a semiconductor substrate is separated by utilizing the growth of microvoids, which are formed by hydrogen ion irradiation, by heat treatment; a method in which a single crystal semiconductor layer is formed on an insulating surface by crystal growth; and the like.

In this embodiment, ions are added through one surface of a single crystal semiconductor substrate, an embrittlement layer is formed at a certain depth from the one surface of the single crystal semiconductor substrate, and an insulating layer is formed on the one surface of the single crystal semiconductor substrate or over the element substrate 1410. Heat treatment is performed in a state where the single crystal semiconductor substrate and the element substrate 1410 are bonded to each other with the insulating layer interposed therebetween, so that a crack is generated in the embrittlement layer and the single crystal semiconductor substrate is separated along the embrittlement layer. Thus, a single crystal semiconductor layer, which is separated from the single crystal semiconductor substrate, is formed as a semiconductor layer over the element substrate 1410. Note that a glass substrate can be used as the element substrate 1410.

Regions electrically insulated from each other may be formed in the semiconductor substrate, and transistors 1411 and 1412 may be manufactured using the regions electrically insulated from each other.

When a channel formation region is formed using a single crystal semiconductor, variations in electrical characteristics, such as threshold voltage, between transistors due to bonding defects at grain boundaries can be reduced. Thus, in the display device according to one embodiment of the present invention, the light-emitting elements can be operated normally without placing a circuit for compensating threshold voltage in each pixel. The number of circuit components per pixel can therefore be reduced, which results in an increase in the flexibility in layout. Thus, a high-definition display device can be achieved. For example, a display device having a matrix of a plurality of pixels, specifically greater than or equal to 350 pixels per one inch (i.e., the horizontal resolution is greater than or equal to 350 pixels per inch (ppi)), more preferably greater than or equal to 400 pixels per one inch (i.e., the horizontal resolution is greater than or equal to 400 ppi) can be achieved.

Moreover, a transistor in which a channel formation region is formed using a single crystal semiconductor can be downsized while current drive capability is kept high. When the downsized transistor is used, a reduction in the area of a circuit portion that does not contribute to display, which results in an increase in the display area in the display portion and a reduction in the frame size of the display device.

<Structure of Pixel>

The pixel portion 1402 is formed using the light-emitting panel according to one embodiment of the present invention. The light-emitting panel includes a plurality of pixels each of which includes a switching transistor 1411, a current control transistor 1412, and a first electrode 1413 electrically connected to a drain of the current control transistor 1412. As a structure of the light-emitting panel provided in the pixel portion 1402, for example, the structure described as an example in Embodiment 3 can be employed. Specifically, a structure may be employed in which a switching transistor is provided in each of the light-emitting elements included in the light-emitting panel described as an example in Embodiment 3. Note that a partition wall 1414 is formed so as to cover an end portion of the first electrode 1413. Here, the partition wall 1414 is formed using a positive photosensitive polyimide film.

Further, the partition wall 1414 is provided such that either an upper end portion or a lower end portion of the partition wall 1414 has a curved surface with a curvature. For example, in the case of using positive photosensitive acrylic as a material for the partition wall 1414, the partition wall 1414 is preferably formed so as to have a curved surface with radius of curvature (0.2 μm to 3 μm) only at the upper end portion thereof. The partition wall 1414 can be formed using either a negative type photosensitive resin which becomes insoluble in an etchant by light irradiation or a positive type photosensitive resin which becomes soluble in an etchant by light irradiation. Note that when a partition wall which covers a reflective film has a light-blocking property, reflection of external light by the reflective film can be suppressed. When a reflective film which extends outside a light-emitting module reflects external light, the contrast of a light-emitting device is lowered; for that reason, bright light emission cannot be obtained. A light-blocking partition wall can be Mimed using a resin layer colored with black.

In the light-emitting device 1400, a second electrode 1417 is provided over a first electrode 1413, and a layer 1416 containing a light-emitting organic compound is provided between the first electrode 1413 and the second electrode 1417, whereby a light-emitting element 1418 is formed. As a structure of the light-emitting element 1418, for example, the structure of the light-emitting element included in the light-emitting panel described as an example in Embodiment 3 can be employed.

The light-emitting device 1400 described as an example in this embodiment has a structure in which the light-emitting element 1418 included in the light-emitting panel according to one embodiment of the present invention is sealed in a space 1407 enclosed by the element substrate 1410, the sealing substrate 1404, and the sealant 1405. Note that the space 1407 is filled with a filler and may be filled with an inert gas (e.g., nitrogen or argon) or the sealant 1405. A material for adsorbing impurities, such as a desiccant, may be provided.

It is desirable that the sealant 1405 and the sealing substrate 1404 be fowled using a material which does not transmit an impurity in the air (e.g., moisture or oxygen) as much as possible. As examples of the sealing substrate 1404, in addition to a glass substrate and a quartz substrate, a plastic substrate formed using fiberglass-reinforced plastics (FRP), polyvinyl fluoride (PVF), polyester, acrylic, and the like can be given. As the sealant 1405, typically, an epoxy-based resin is preferably used.

Note that a color filter 1434 is provided for the sealing substrate 1404 so as to overlap with the light-emitting element 1418, and a light-blocking film 1435 (also referred to as black matrix) is provided so as to overlap with a portion between two adjacent light-emitting elements.

In the above active matrix light-emitting device according to one embodiment of the present invention, the light-emitting panel is used which includes a light-emitting element including a layer containing a light-emitting organic compound between the one electrode including the first metal, whose surface is provided with the conductive inclusion, and the other electrode. As a result, a light-emitting device in which loss due to electrical resistance is reduced can be provided.

<Passive Matrix Light-Emitting Device>

Figure 7A:
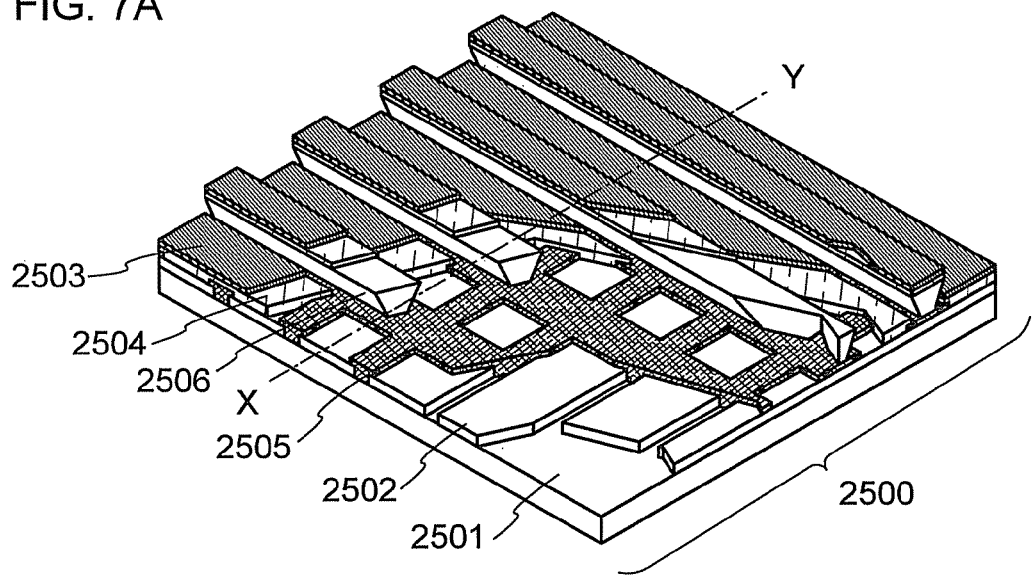
FIGS. 7A and 7B illustrate a light-emitting device according to one embodiment.
Figure 7B:
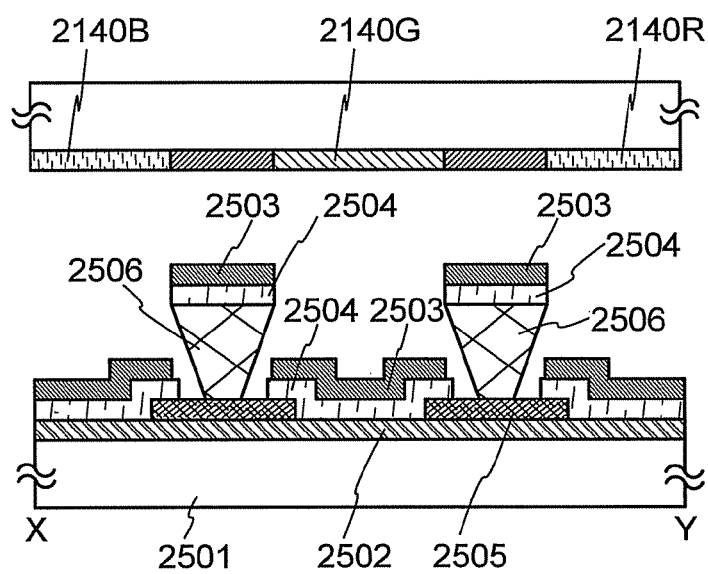

Next, a structure in which the light-emitting panel according to one embodiment of the present invention is applied to a passive matrix light-emitting device is illustrated in FIGS. 7A and 7B. Note that FIG. 7A is a perspective view of a light-emitting panel included in the light-emitting device and FIG. 7B is a cross-sectional view of the light-emitting device taken along a line X-Y in FIG. 7A.

A passive matrix light-emitting device 2500 includes a first electrode 2502 over a substrate 2501. Further, an insulating layer 2505 is provided so as to cover an end portion of the first electrode 2502, and a partition layer 2506 is provided over the insulating layer 2505.

Further, a color filter 2140R which transmits red light, a color filter 2140G which transmits green light, and a color filter 2140B which transmits blue light are provided over their respective light-emitting elements.

The light-emitting device 2500 is manufactured using the light-emitting panel according to one embodiment of the present invention. As a structure of the light-emitting panel, for example, the structure described as an example in Embodiment 3 can be employed. The second electrode 2503 is provided over the first electrode 2502, and a layer 2504 containing a light-emitting organic compound is provided between the first electrode 2502 and the second electrode 2503, so that a light-emitting element is formed. As a structure of the light-emitting element, for example, the structure of the light-emitting element included in the light-emitting panel described as an example in Embodiment 3 can be employed. Note that a light-emitting module included in the light-emitting panel of this embodiment includes the light-emitting element including the layer containing a light-emitting organic compound which emits white light between the pair of electrodes and the color filter overlapping with the light-emitting element.

The sidewalls of the partition layer 2506 slope so that the distance between one sidewall and the other sidewall gradually decreases toward the surface of the substrate. In other words, a cross section taken along the direction of the short side of the partition layer 2506 is trapezoidal, and the base (a side which is in the same direction as a plane direction of the insulating layer 2505 and in contact with the insulating layer 2505) is shorter than the upper side (a side which is in the same direction as the plane direction of the insulating layer 2505 and not in contact with the insulating layer 2505). With the partition layer 2506 provided as described above, a defect of the light-emitting element due to electrical crosstalk or the like can be prevented.

In the above passive matrix light-emitting device according to one embodiment of the present invention, the light-emitting panel which includes a light-emitting element including a layer containing a light-emitting organic compound between the one electrode including the first metal, whose surface is provided with the conductive inclusion, and the other electrode. As a result, a light-emitting device in which loss due to electrical resistance is reduced can be provided.

Note that this embodiment can be combined with any of the other embodiments as appropriate.

Embodiment 5

In this embodiment, examples of a light-emitting device including a light-emitting panel according to one embodiment of the present invention, which includes a light-emitting element including a layer containing a light-emitting organic compound between one electrode including a first metal, whose surface is provided with a conductive inclusion, and the other electrode, will be described with reference to FIGS. 8A to 8E.

Examples of the electronic devices to which the light-emitting device is applied are television devices (also referred to as TV or television receivers), monitors for computers and the like, cameras such as digital cameras and digital video cameras, digital photo frames, cellular phones (also referred to as portable telephone devices), portable game machines, portable information terminals, audio playback devices, large game machines such as pachinko machines, and the like. Specific examples of these electronic devices are illustrated in FIGS. 8A to 8E.

Figure 8A:
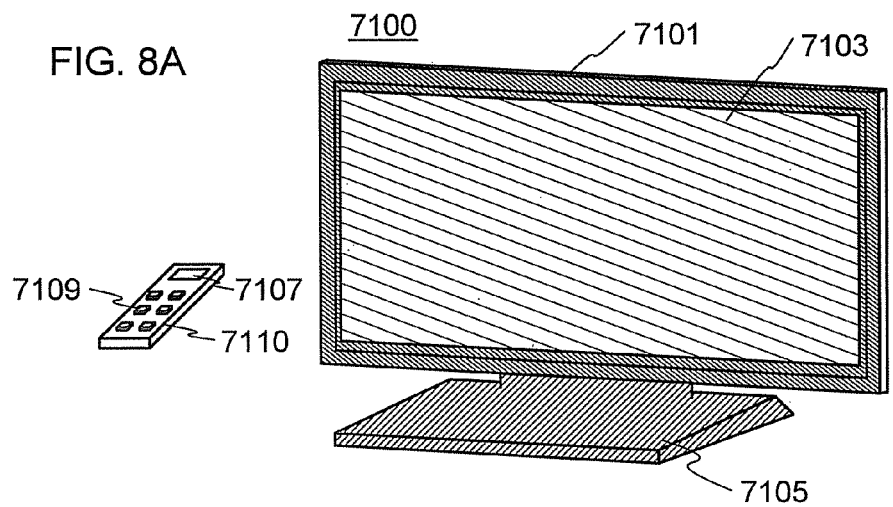
FIGS. 8A to 8E illustrate light-emitting devices according to one embodiment.

FIG. 8A illustrates an example of a television device. In the television device 7100, a display portion 7103 is incorporated in a housing 7101. The display portion 7103 is capable of displaying images, and the light-emitting device can be used for the display portion 7103. In addition, here, the housing 7101 is supported by a stand 7105.

The television device 7100 can be operated by an operation switch of the housing 7101 or a separate remote controller 7110. With operation keys 7109 of the remote controller 7110, channels and volume can be controlled and images displayed on the display portion 7103 can be controlled. Furthermore, the remote controller 7110 may be provided with a display portion 7107 for displaying data output from the remote controller 7110.

Note that the television device 7100 is provided with a receiver, a modem, and the like. With the receiver, a general television broadcast can be received. Furthermore, when the television device 7100 is connected to a communication network by wired or wireless connection via the modem, one-way (from a transmitter to a receiver) or two-way (between a transmitter and a receiver, between receivers, or the like) data communication can be performed.

Figure 8B:
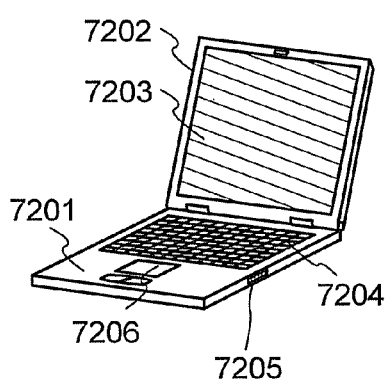

FIG. 8B illustrates a computer, which includes a main body 7201, a housing 7202, a display portion 7203, a keyboard 7204, an external connecting port 7205, a pointing device 7206, and the like. Note that this computer is manufactured using the light-emitting device for the display portion 7203.

Figure 8C:
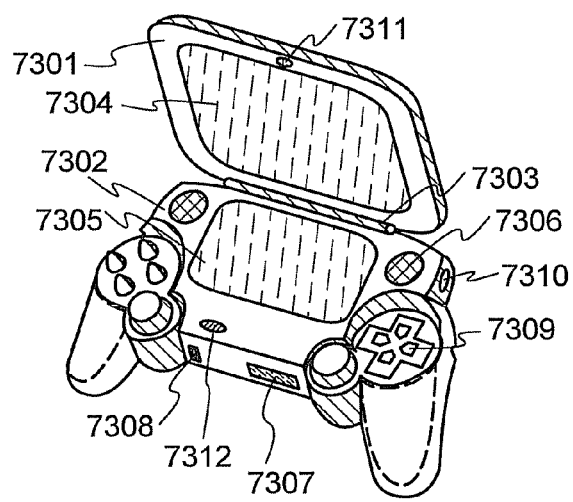

FIG. 8C illustrates a portable game machine, which includes two housings, a housing 7301 and a housing 7302, which are connected with a joint portion 7303 so that the portable game machine can be opened or folded. A display portion 7304 is incorporated in the housing 7301 and a display portion 7305 is incorporated in the housing 7302. In addition, the portable game machine illustrated in FIG. 8C includes a speaker portion 7306, a recording medium insertion portion 7307, an LED lamp 7308, an input means (an operation key 7309, a connection terminal 7310, a sensor 7311 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), or a microphone 7312), and the like. Needless to say, the structure of the portable game machine is not limited to the above as long as a light-emitting device can be used for at least either the display portion 7304 or the display portion 7305, or both, and may include other accessories as appropriate. The portable game machine illustrated in FIG. 8C has a function of reading out a program or data stored in a storage medium to display it on the display portion, and a function of sharing information with another portable game machine by wireless communication. The portable game machine in FIG. 8C can have a variety of functions without limitation to the above functions.

Figure 8D:
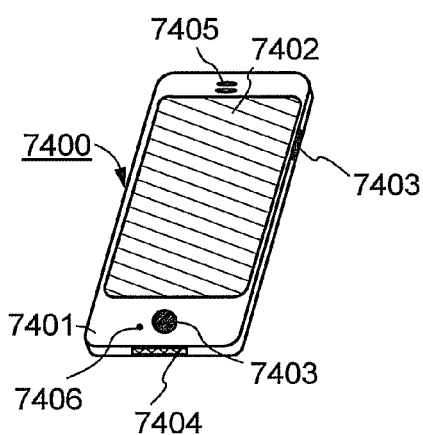

FIG. 8D illustrates an example of a mobile phone. The mobile phone 7400 is provided with a display portion 7402 incorporated in a housing 7401, operation buttons 7403, an external connection port 7404, a speaker 7405, a microphone 7406, and the like. Note that the mobile phone 7400 is manufactured using the light-emitting device for the display portion 7402.

When the display portion 7402 of the mobile phone 7400 illustrated in FIG. 8D is touched with a finger or the like, data can be input into the mobile phone 7400. Further, operations such as making a call and creating e-mail can be performed by touch on the display portion 7402 with a finger or the like.

There are mainly three screen modes of the display portion 7402. The first mode is a display mode mainly for displaying images. The second mode is an input mode mainly for inputting data such as text. The third mode is a display-and-input mode in which two modes of the display mode and the input mode are combined.

For example, in the case of making a call or composing an e-mail, a text input mode mainly for inputting text is selected for the display portion 7402 so that text displayed on a screen can be inputted. In this case, it is preferable to display a keyboard or number buttons on almost the entire screen of the display portion 7402.

When a detection device including a sensor for detecting inclination, such as a gyroscope or an acceleration sensor, is provided inside the mobile phone 7400, display on the screen of the display portion 7402 can be automatically changed by determining the orientation of the mobile phone 7400 (whether the mobile phone is placed horizontally or vertically for a landscape mode or a portrait mode).

The screen modes are switched by touching the display portion 7402 or operating the operation buttons 7403 of the housing 7401. The screen modes can also be switched depending on kinds of images displayed on the display portion 7402. For example, when a signal of an image displayed on the display portion is a signal of moving image data, the screen mode is switched to the display mode. When the signal is a signal of text data, the screen mode is switched to the input mode.

Moreover, in the input mode, when input by touching the display portion 7402 is not performed within a specified period while a signal detected by an optical sensor in the display portion 7402 is detected, the screen mode may be controlled so as to be switched from the input mode to the display mode.

The display portion 7402 may function as an image sensor. For example, an image of a palm print, a fingerprint, or the like is taken by touch on the display portion 7402 with the palm or the finger, whereby personal authentication can be performed. Further, by providing a backlight or a sensing light source which emits a near-infrared light in the display portion, an image of a finger vein, a palm vein, or the like can be taken.

Figure 8E:
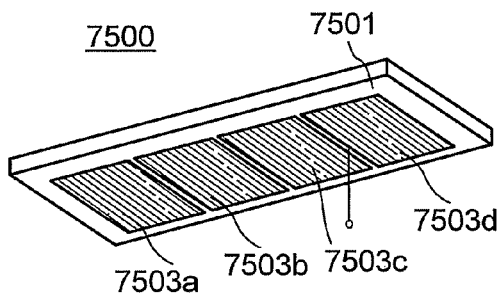

FIG. 8E illustrates an example of a lighting device. In a lighting device 7500, light-emitting devices 7503a to 7503d of one embodiment of the present invention are incorporated in a housing 7501 as light sources. The lighting device 7500 can be attached to a ceiling, a wall, or the like.

The light-emitting device according to one embodiment of the present invention includes a light-emitting panel in a thin film form. Thus, when the light-emitting device is attached to a base with a curved surface, the light-emitting device with a curved surface can be obtained. In addition, when the light-emitting device is located in a housing with a curved surface, an electronic device or a lighting device with a curved surface can be obtained.

The above light-emitting device according to one embodiment of the present invention includes the light-emitting panel according to one embodiment of the present invention which includes a light-emitting element including a layer containing a light-emitting organic compound between one electrode including a first metal, whose surface is provided with a conductive inclusion, and the other electrode. As a result, a light-emitting device in which loss due to electrical resistance is reduced can be provided.

Note that this embodiment can be combined with any of the other embodiments in this specification as appropriate.

This application is based on Japanese Patent Application Serial No. 2011-106409 filed with the Japan Patent Office on May 11, 2011, the entire contents of which are hereby incorporated by reference.

What is claimed is:

1. A light-emitting element comprising:
   one electrode comprising a first metal;
   the other electrode having a property of transmitting visible light and overlapping with the one electrode;
   a layer containing a light-emitting organic compound between the one electrode and the other electrode; and
   a conductive inclusion between the one electrode and the layer containing the light-emitting organic compound,
   wherein the conductive inclusion contains an oxide of a second metal,
   wherein a carrier-injection layer is provided between the oxide of the second metal and the layer containing the light-emitting organic compound,
   wherein the first metal includes an alloy containing aluminum, nickel, and lanthanum, and
   wherein the second metal contained in the conductive inclusion includes titanium.

2. A light-emitting element comprising:
   one electrode comprising a first metal;
   the other electrode having a property of transmitting visible light and overlapping with the one electrode;
   a layer containing a light-emitting organic compound between the one electrode and the other electrode; and
   a conductive inclusion between the one electrode and the layer containing the light-emitting organic compound,
   wherein the conductive inclusion contains an oxide of a second metal, wherein the oxide of the second metal is in contact with a carrier-injection layer provided in the layer containing the light-emitting organic compound, wherein the first metal includes an alloy containing aluminum, nickel, and lanthanum, and wherein the second metal contained in the conductive inclusion includes titanium.

3. The light-emitting element according to claim 1 or 2, wherein the conductive inclusion is a stack of a layer containing the second metal and a layer containing the oxide of the second metal.

4. The light-emitting element according to claim 1 or 2, wherein the conductive inclusion is a stack comprising a granular body containing the second metal and a layer which evenly covers the granular body and contains the oxide of the second metal.

5. The light-emitting element according to claim 1 or 2, wherein the conductive inclusion is a granular body containing the second metal and a layer containing the oxide of the second metal on a surface of the second metal.

6. The light-emitting element according to claim 1 or 2, wherein the carrier-injection layer is an oxide conductive film or an organic material layer containing an acceptor material and has a property of transmitting visible light.

7. The light-emitting element according to claim 1 or 2, wherein a thickness of the first metal is greater than or equal to 100 nm and less than or equal to 300 nm.

8. The light-emitting element according to claim 1 or 2, wherein, with respect to visible light, the other electrode has a reflectance greater than or equal to 1% and less than 100%, and wherein, with respect to visible light, the other electrode has a transmittance greater than or equal to 1% and less than 100%.

9. A light-emitting module comprising the light-emitting element according to claim 8, wherein the light-emitting module comprises:

a color filter overlapping with the light-emitting element, wherein the light-emitting element comprises the layer containing a light-emitting organic compound so as to emit light comprising light with a wavelength greater than or equal to 600 nm and less than 800 nm, light with a wavelength greater than or equal to 500 nm and less than 600 nm, and light with a wavelength greater than or equal to 400 nm and less than 500 nm.

10. A light-emitting panel comprising a plurality of light-emitting modules according to claim 9, wherein the light-emitting panel comprises:

a first light-emitting module;
a second light-emitting module; and
a third light-emitting module, wherein the first light-emitting module comprises a first color filter transmitting red light, wherein an optical path length between a pair of first electrodes, one of which has a reflective property and the other of which has a semi-transmissive and semi-reflective property, is adjusted with the use of a thickness of a first carrier-injection layer so that light with a wavelength greater than or equal to 600 nm and less than 800 nm is emitted, wherein the second light-emitting module comprises a second color filter transmitting green light, wherein an optical path length between a pair of second electrodes, one of which has a reflective property and the other of which has a semi-transmissive and semi-reflective property, is adjusted with the use of a thickness of a second carrier-injection layer so that light with a wavelength greater than or equal to 500 nm and less than 600 nm is emitted, wherein the third light-emitting module comprises a third color filter transmitting blue light, wherein an optical path length between a pair of third electrodes, one of which has a reflective property and the other of which has a semi-transmissive and semi-reflective property, is adjusted with the use of a thickness of a third carrier-injection layer so that light with a wavelength greater than or equal to 400 nm and less than 500 nm is emitted, wherein the first, second and third light-emitting modules comprise a same layer containing the light-emitting organic compound, and wherein the one of the pair of first electrodes, the one of the pair of second electrodes, and the one of the pair of third electrodes are independent of one another.

11. A light-emitting panel according to claim 10, wherein the other of the pair of first electrodes, the other of the pair of second electrodes, and the other of the pair of third electrodes are in contact with each other.

12. A light-emitting device comprising the light-emitting panel according to claim 10.

13. The light-emitting device according to claim 12, wherein the light-emitting device is incorporated in one selected from the group consisting of a television device, a computer, a portable game machine, a mobile phone and a lighting device.

* * * * *